United States Patent
Ogawa

(10) Patent No.: US 10,643,327 B2
(45) Date of Patent: May 5, 2020

(54) INSPECTION METHOD AND INSPECTION APPARATUS

(71) Applicant: NuFlare Technology, Inc., Yokohama-shi (JP)

(72) Inventor: Riki Ogawa, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 118 days.

(21) Appl. No.: 15/343,339

(22) Filed: Nov. 4, 2016

(65) Prior Publication Data

US 2017/0132772 A1 May 11, 2017

(30) Foreign Application Priority Data

Nov. 5, 2015 (JP) ................................ 2015-217962

(51) Int. Cl.
*G06T 7/00* (2017.01)
*G03F 1/84* (2012.01)
(Continued)

(52) U.S. Cl.
CPC ......... *G06T 7/001* (2013.01); *G01N 21/9505* (2013.01); *G01N 21/95607* (2013.01); *G02B 27/283* (2013.01); *G03F 1/84* (2013.01); *G06K 9/6202* (2013.01); *G01N 2021/8848* (2013.01); *G01N 2021/8861* (2013.01);
(Continued)

(58) Field of Classification Search
CPC .......... G06T 7/001; G06T 2207/30148; H04N 5/2256; G01N 21/9505; G01N 21/95607; G02B 27/283; G06K 9/6202
See application file for complete search history.

(56) References Cited

U.S. PATENT DOCUMENTS 5,838,433 A * 11/1998 Hagiwara ........ G01N 21/95623
356/364
6,163,367 A * 12/2000 Obszarny ................. G03F 1/29
355/53
(Continued)

FOREIGN PATENT DOCUMENTS

JP 2009151030 A * 7/2009
JP 2012-220388 11/2012
(Continued)

*Primary Examiner* — Richard A Hansell, Jr.
(74) *Attorney, Agent, or Firm* — Oblon, McClelland, Maier & Neustadt, L.L.P.

(57) ABSTRACT

An inspection apparatus includes a tone correction unit, a dimensional error acquisition unit, and a map generating unit. The correction unit acquires a transmissivity distribution for transmission of light from a light source through an incident surface of an inspection target based on the optical image data to correct a tone of the optical image data so as to eliminate variations in contrast of the optical image data which correspond to the transmissivity distribution. The acquisition unit determines a dimension of the pattern based on the corrected optical image data to acquire a dimensional error that is a difference between the dimension of the pattern and a design value for the pattern. The generating unit generates a map in which the dimensional error is associated with the position coordinates of the table on the inspection target based on the position coordinates and the dimensional error.

9 Claims, 12 Drawing Sheets

(51) Int. Cl.
  *G01N 21/95* (2006.01)
  *G01N 21/956* (2006.01)
  *G02B 27/28* (2006.01)
  *G06K 9/62* (2006.01)
  *G01N 21/88* (2006.01)
  *H04N 5/225* (2006.01)

(52) U.S. Cl.
  CPC .......... *G01N 2021/8874* (2013.01); *G01N 2021/95676* (2013.01); *G06T 2207/30148* (2013.01); *H04N 5/2256* (2013.01); *H04N 5/2258* (2013.01)

(56) References Cited

U.S. PATENT DOCUMENTS

| | | | | |
|---|---|---|---|---|
| 6,396,943 | B2* | 5/2002 | Yamashita | G06T 7/001 382/144 |
| 9,196,033 | B2* | 11/2015 | Hashimoto | G06T 7/001 |
| 9,762,805 | B2* | 9/2017 | Nakata | H04N 5/2351 |
| 2004/0165761 | A1* | 8/2004 | Hung | G03F 7/7065 382/141 |
| 2004/0218223 | A1* | 11/2004 | Bernardi | G06T 5/009 358/3.26 |
| 2005/0083518 | A1* | 4/2005 | Ki | G03F 7/70591 356/124 |
| 2008/0260234 | A1* | 10/2008 | Yamashita | G01N 21/95607 382/144 |
| 2010/0021042 | A1* | 1/2010 | Preil | G03F 1/84 382/144 |
| 2012/0140060 | A1* | 6/2012 | Tsuchiya | G01N 21/95607 348/126 |
| 2013/0250095 | A1* | 9/2013 | Inoue | G06T 7/0004 348/94 |
| 2016/0370300 | A1 | 12/2016 | Ogawa et al. | |

FOREIGN PATENT DOCUMENTS

| | | | |
|---|---|---|---|
| JP | 2012220388 A | * | 11/2012 |
| JP | 2012220388 A | * | 11/2012 |
| JP | 2017-9379 A | | 1/2017 |
| KR | 20100134445 A | * | 12/2010 |

* cited by examiner

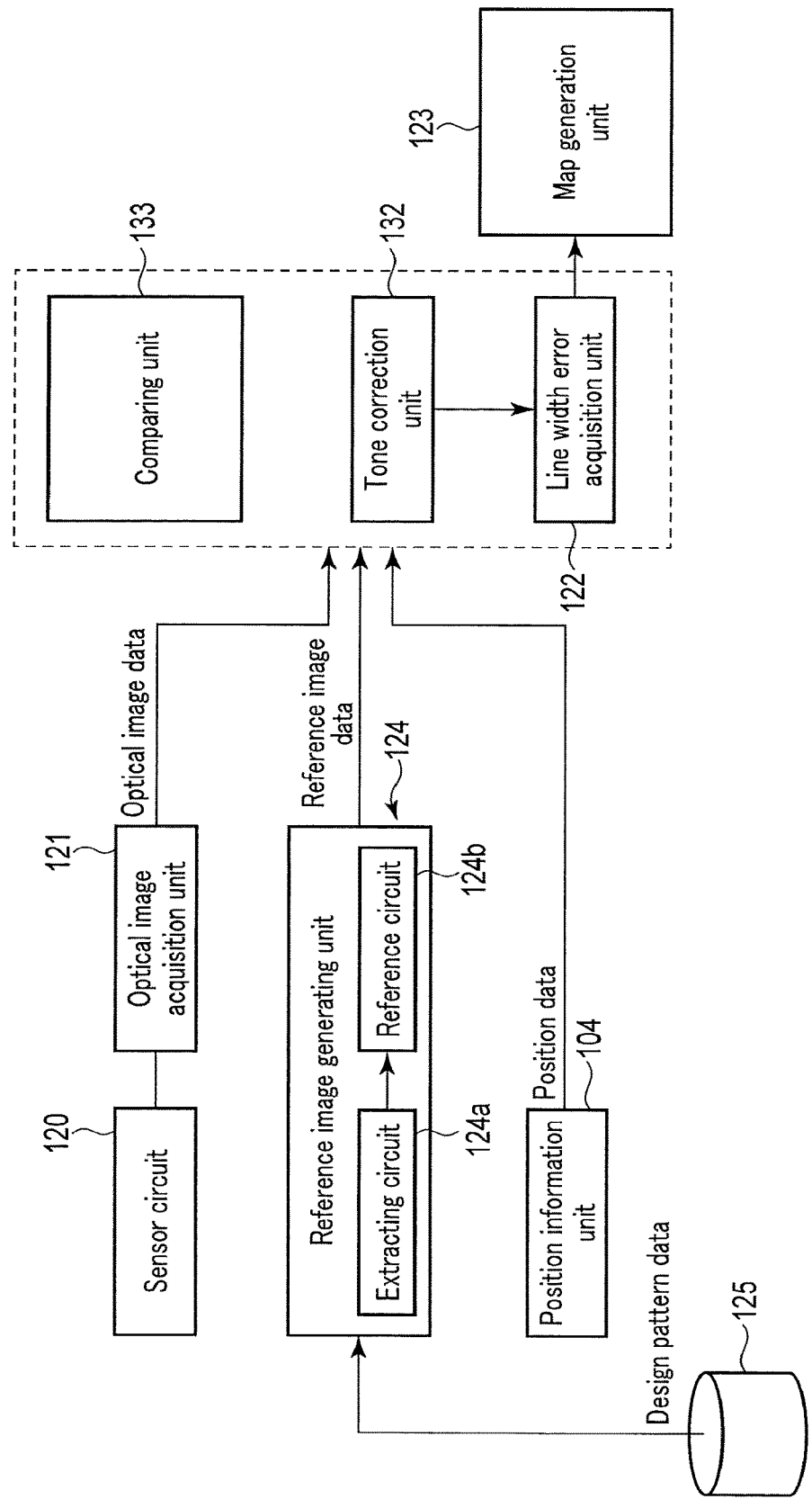
F I G. 4

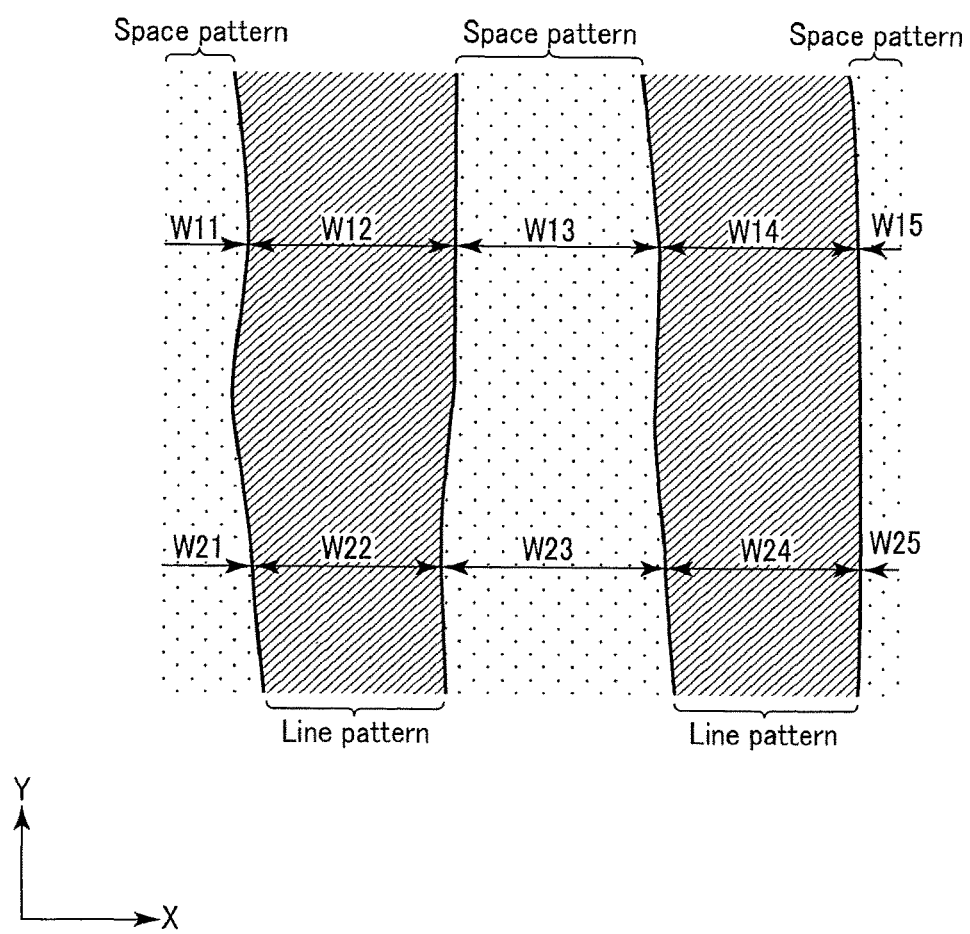
F I G. 7

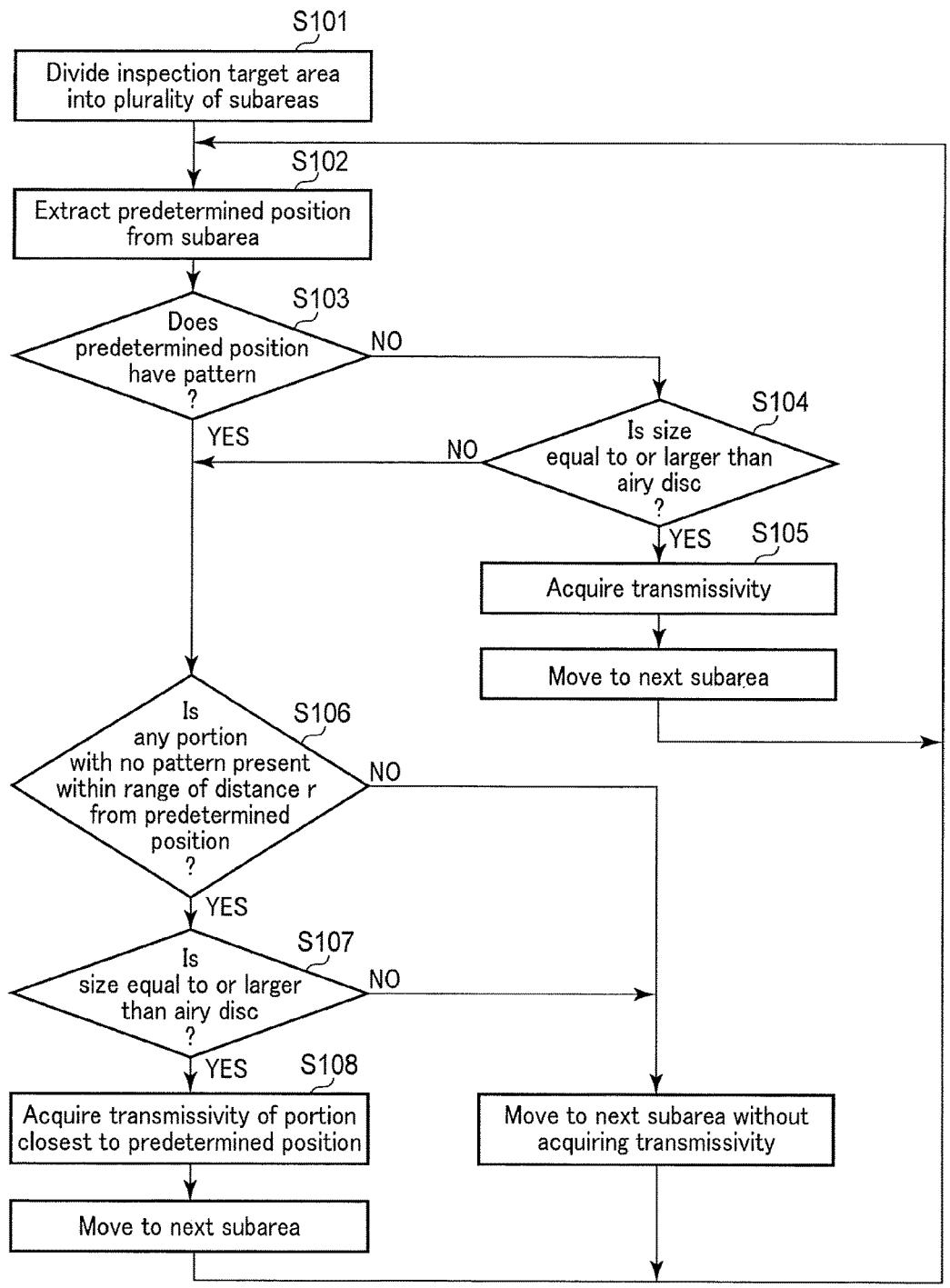
F I G. 9

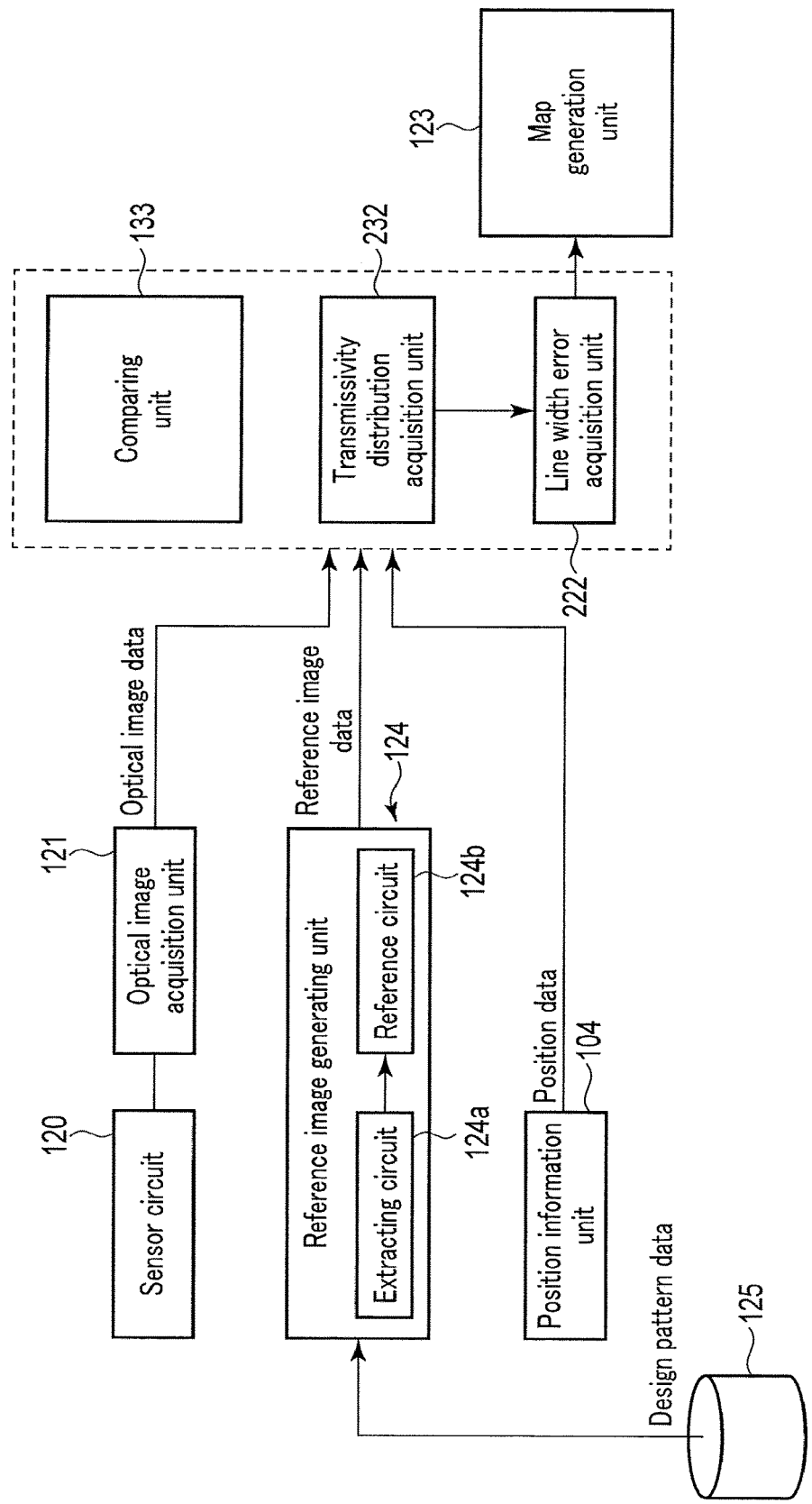
F I G. 12

INSPECTION METHOD AND INSPECTION APPARATUS

CROSS-REFERENCE TO RELATED APPLICATION

This application is based upon and claims the benefit of priority from Japanese Patent Application No. 2015-217962, filed Nov. 5, 2015, the entire contents of which are incorporated herein by reference.

FIELD

Embodiments described herein relate to an inspection apparatus and an inspection method.

BACKGROUND

In a manufacturing process for semiconductor devices, a reduced-projection exposure apparatus referred to as a stepper or a scanner exposes and transfers an original image pattern (referred to as a mask or a reticle. The mask and reticle are hereinafter collectively referred to as a mask) in which a circuit pattern is formed, onto a wafer. For LSIs that involve high manufacturing costs, improving the yield in the manufacturing process is essential. A defect in a mask pattern is a major factor that reduces the yield of semiconductor devices. Thus, when a mask is manufactured, an inspection process for detecting possible defects is important.

In the inspection process, not only are possible defects detected but also the line width (CD: critical dimension) of a pattern in a mask surface is measured so as to allow mapping of the distribution of amounts of misalignment (critical dimension errors $\Delta CD$) between the measured line width and the line width in a design pattern. The resultant $\Delta CD$ map is fed back to the mask manufacturing process and utilized to review process conditions.

An inspection apparatus in which light having exited a light source is split into two optical paths including an optical path that illuminates a mask as an inspection target with transmitted light and an optical path that illuminates the mask with reflected light is disclosed. The inspection apparatus performs inspection by acquiring an optical image of a pattern on the mask using a sensor on which light transmitted through the mask is incident and a sensor on which light reflected by the mask is incident. In the inspection apparatus, a polarization beam splitter is arranged on the optical path through which the light transmitted through the mask is incident on the sensor. The polarization beam splitter is coupled to the optical path that illuminates the mask with the reflected light. The light reflected by the polarization beam splitter illuminates the mask and is reflected by the mask. The light is then transmitted through the polarization beam splitter and enters the sensor.

In general, the mask includes a glass substrate such as a quartz substrate and a pattern formed of a light shielding film such as a chromium film provided on a surface of the glass substrate. The glass substrate exhibits birefringence, and the directions of the birefringence vary with position due to distortion of the interior of the substrate. Thus, disadvantageously, the polarization state of the light changes at the time of transmission through the mask, and the amount of light transmitted through the polarization beam splitter decreases. Specifically, upon being transmitted through the mask, circularly polarized light turns into elliptically polarized light due to the difference in the directions of the birefringence in the mask surface. The light transmitted through the mask is originally changed, by a quarter-wavelength plate, from the circularly polarized light to linearly polarized light having only a P polarization component with respect to the polarization beam splitter. The linearly polarized light is then transmitted through the polarization beam splitter. However, when the elliptically polarized light is incident on the quarter-wavelength plate, the light entering the polarization beam splitter is not linearly polarized, or linearly polarized light having an S polarization component with respect to the polarization beam splitter enters the polarization beam splitter. As a result, the amount of light transmitted through the polarization beam splitter decreases, varying the measured value of the pattern line width in the mask surface.

In connection with this problem, a part of the quartz substrate in which no pattern is formed is, before defect inspection, illuminated with light so as to allow light transmitted through the substrate to enter the sensor, allowing brightness distribution data to be generated. The brightness distribution data is then used to correct a brightness value in the actual inspection. However, acquiring brightness distribution data before the inspection needs much effort and time. No description of generation of a $\Delta CD$ map is disclosed.

BRIEF DESCRIPTION OF THE DRAWINGS

FIG. 4 is a diagram illustrating an example of a flow of data in the inspection apparatus in FIG. 1;

FIG. 7 is a partial plan view of a line and space pattern that is an example of a measured pattern;

FIG. 9 is a diagram of an example of an extraction method for portions for which transmissivity is measured;

FIG. 12 is a diagram illustrating an example of a flow of data in the inspection apparatus in FIG. 10.

DETAILED DESCRIPTION

An object of the embodiments is to provide an inspection apparatus and an inspection method that reduce the adverse effect of birefringence in the substrate to enable defect inspection to be easily and accurately achieved and that allows an accurate $\Delta CD$ map to be acquired.

Other objects and advantages of the embodiments will be apparent from the description below.

In general, according to one embodiment, an inspection apparatus includes a table, a position measuring unit, a light source, a transmitted illumination optical system, a reflected illumination optical system, a first sensor, a second sensor, a polarization beam splitter, a defect detecting unit, a tone correction unit, a dimensional error acquisition unit, and a map generating unit. The table is on which an inspection target is placed. The position measuring unit is configured to measure position coordinates of the table. The light source is configured to emit light that illuminates the inspection target. The transmitted illumination optical system is configured to illuminate the inspection target with a first light from the light source such that the first light is transmitted through the inspection target. The reflected illumination optical system is configured to illuminate the inspection target with a second light from the light source such that the second light is reflected by the inspection target. The first sensor is entered by the first light to convert an optical image of the inspection target into an electric signal. The second sensor is entered by the second light to convert an optical image of the inspection target into an electric signal. The polarization beam splitter is configured to transmit the first light and the second light. The defect detecting unit is configured to detect possible defects in a pattern provided on the inspection target using optical image data output from at least one of the first sensor and the second sensor. The tone correction unit is configured to acquire a transmissivity distribution for transmission of light from the light source through an incident surface of the inspection target based on the optical image data to correct a tone of the optical image data so as to eliminate variations in contrast of the optical image data which correspond to the transmissivity distribution. The dimensional error acquisition unit is configured to determine a dimension of the pattern based on the corrected optical image data to acquire a dimensional error that is a difference between the dimension of the pattern and a design value for the pattern. The map generating unit is configured to generate a map in which the dimensional error is associated with the position coordinates of the table on the inspection target based on the position coordinates and the dimensional error.

Embodiment 1

Figure 1:
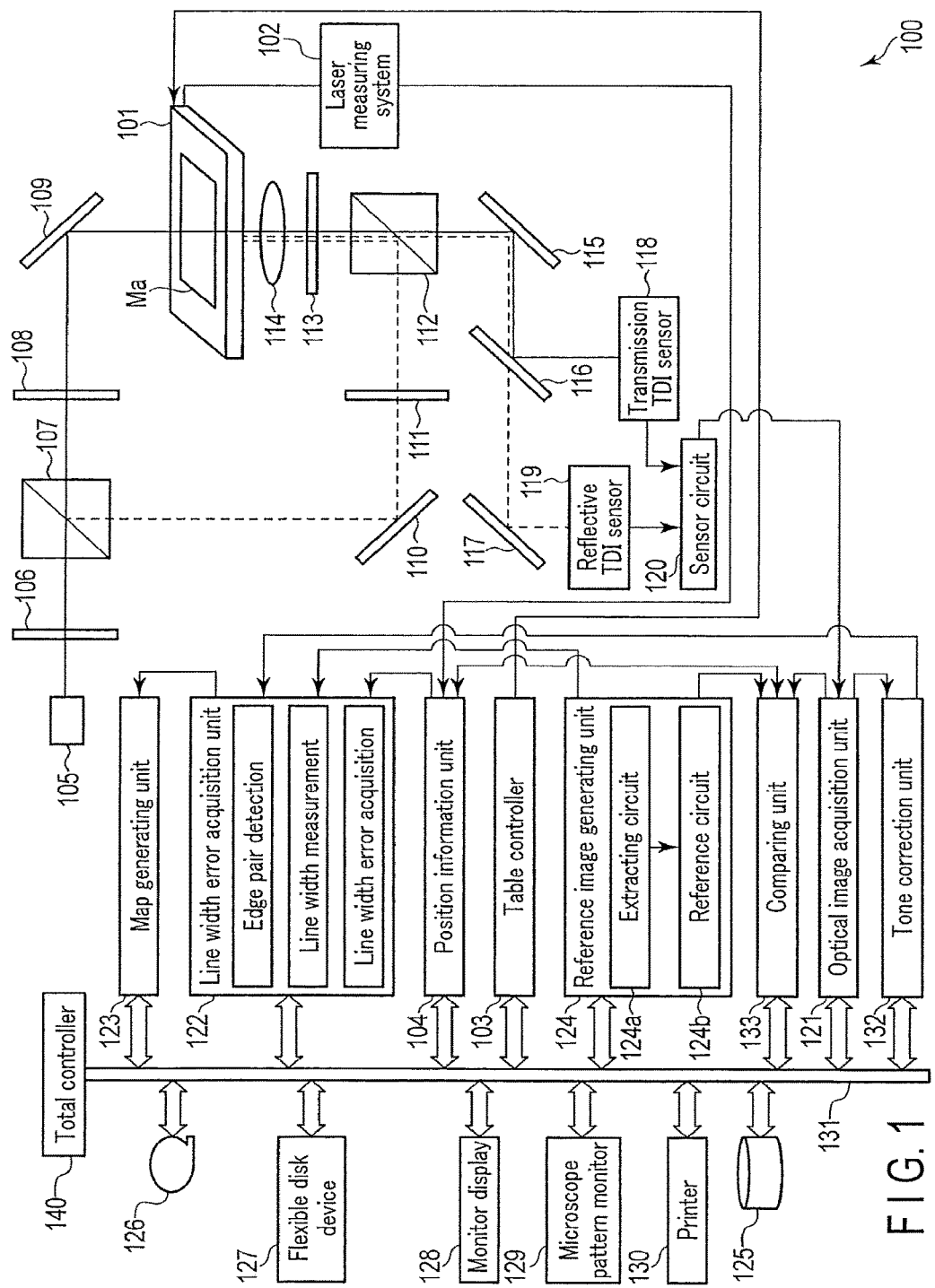
FIG. 1 is a schematic diagram of a configuration of an inspection apparatus in Embodiment 1.

FIG. 1 is a schematic diagram of an inspection apparatus 100 in the present embodiment. The inspection apparatus 100 acquires optical image data on an inspection target. The inspection apparatus 100 then compares the optical image data with reference image data corresponding to the optical image data to detect possible defects in the inspection target. The inspection apparatus 100 also measures the line width (CD: Critical Dimension) of the inspection target in the optical image data to acquire the amount of deviation from the line width (critical dimension error ΔCD) of each pattern in the reference image data. The inspection apparatus 100 then maps the distribution of line width errors (ΔCD map) in a surface of the inspection target.

Main components of the inspection apparatus 100 are as follows.

The inspection apparatus 100 includes a table 101 that serves as a unit acquiring optical image data on a mask Ma as an example of the inspection target and that is movable in a horizontal direction (X direction and Y direction) and a rotating direction (θ-axis direction), a laser measuring system 102 that serves as a position measuring unit measuring position coordinates of the table 101, a light source 105 that emits light that illuminates the mask Ma, an illuminating optical system that illuminates the mask Ma placed on the table 101 with the light from the light source 105, and an imaging unit that generates optical image data on the mask Ma. The mask Ma is, for example, a pattern to be inspected (inspection target pattern) that is formed on a principal surface of a glass substrate such as a quartz substrate.

Operations of the table 101 are controlled by a table controller 103. Specifically, the table controller 103 drives an X-axis motor, a Y-axis motor, and a θ-axis motor (not depicted in the drawings) to move the table 101 in the horizontal direction (X direction and Y direction) and the rotating direction (θ-axis direction). For a driving mechanism for the table 101, for example, a combination of an air slider and a linear motor, a stepping motor, or the like is used.

The laser measuring system 102 is an example of a position measuring unit in the embodiments and is used to measure position coordinates of the table 101. Although not illustrated in detail, the laser measuring system 102 includes a laser interferometer such as a heterodyne interferometer. The laser interferometer radiates and receives light to and from mirrors for the X axis and the Y axis provided on the table 101 to measure the position coordinates of the table 101. Measurement data from the laser measuring system 102 is sent to a position information unit 104. A method for measuring the position coordinates of the table 101 is not limited to the use of the laser interferometer, and a magnetic linear encoder or an optical linear encoder may be used instead.

The light source 105 may be, for example, a laser light source that emits DUV (Deep Ultraviolet radiation) light. Light emitted from the laser light source is normally linearly polarized. In the present embodiment, the linearly polarized light is turned into circularly polarized light by a quarter-wavelength plate, and the mask Ma is illuminated with the circularly polarized light. Consequently, an optical image with non-directional resolution characteristics is obtained.

The illuminating optical system that illuminates the mask Ma includes half-wavelength plates 106 and ill, a polarization beam splitter 107 (first polarization beam splitter), a quarter-wavelength plate 108 (first quarter-wavelength plate), a quarter-wavelength plate 113 (second quarter-wavelength plate), mirrors 109 and 110, an objective lens 114, and a polarization beam splitter 112 (second polarization beam splitter). The illuminating optical system may include, for example, a device that turns light emitted from the light source 105 into a light source shape such as a point light source or a bracelet shape, as needed.

The illuminating optical system in the present embodiment includes a transmission illuminating optical system that illuminates the mask Ma with transmitted light and a reflective illuminating optical system that illuminates the mask Ma with reflected light. As seen in FIG. 1, the transmission illuminating optical system includes the half-wavelength plate 106, the polarization beam splitter 107 (first polarization beam splitter), the quarter-wavelength plate 108 (first quarter-wavelength plate), and the mirror 109. The reflective illuminating optical system includes the half-wavelength plates 106 and 111, the polarization beam splitter 107 (first polarization beam splitter), the quarter-wavelength plate 113 (second quarter-wavelength plate), and the objective lens 114. The half-wavelength plate 106 and the polarization beam splitter 107 (first polarization beam splitter) are common to the transmission illuminating optical system and the reflective illuminating optical system.

The polarization beam splitter 112 (second polarization beam splitter) is arranged between the mask Ma and the imaging unit. The polarization beam splitter 112 allows the linearly polarized light (p-polarized light) transmitted through the quarter-wavelength plate 113 to pass through to the imaging unit. The polarization beam splitter 112 is also positioned on an optical path that illuminates the mask Ma with reflected light. The polarization beam splitter 112 reflects the linearly polarized light (s-polarized light) reflected by the polarization beam splitter 107 toward the mask Ma. The light reflected by the mask Ma is transmitted through the polarization beam splitter 113 toward the imaging unit.

The polarization beam splitter 107 is not the only optical unit that branches light emitted from the light source 105 into the optical path that illuminates the mask Ma with transmitted light and the optical path that illuminates the mask Ma with reflected light. Any optical unit may be used so long as the optical unit allows splitting of a light flux. For example, a beam splitter may be used which does not have a function to separate light into polarization components. In the present embodiment, the apparatus may be configured to switch between the transmitted illumination and the reflected illumination using a mirror without allowing branching of the light from the light source 105. Alternatively, the apparatus may have a light source for transmitted illumination and a light source for reflected illumination rather than using a single light source.

The imaging unit that generates optical image data on the mask Ma includes an image-forming optical system that focuses each of light transmitted through the mask Ma and light reflected by the mask Ma to form an optical image of the pattern of the mask Ma, a transmission TDI sensor 118 (first sensor) entered by light transmitted through the light-forming optical system to photoelectrically convert the optical image of the pattern of the mask Ma, a reflective TDI sensor 119 (second sensor) entered by light reflected by the mask Ma to photoelectrically convert the optical image of the pattern of the mask Ma, and a sensor circuit 120 that converts analog signals output from the transmission TDI sensor 118 and the reflective TDI sensor 119 into digital signals.

The image-forming optical system in the imaging unit includes the objective lens 114, the quarter-wavelength plate 113, the polarization beam splitter 112, and the mirrors 115, 116, and 117. The objective lens 114, the quarter-wavelength plate 113, and the polarization beam splitter 112 are common to the image-forming optical system and the illuminating optical system.

Light having emitted from the light source 105 illuminates the mask Ma and then enters the imaging unit while having characteristics of the light varied as described below by optical members forming the transmitted illumination optical system or the reflected illumination optical system.

Light having emitted from the light source 105 is branched by the polarization beam splitter 107 as the first polarization beam splitter, into an optical path that illuminates the mask Ma with transmitted light and an optical path that illuminates the mask Ma with reflected light.

The quarter-wavelength plates 108 and 113 are arranged on the optical path that illuminates the mask Ma with transmitted light. The quarter-wavelength plate 108 turns linearly polarized light (p-polarized light) having been transmitted through the polarization beam splitter 107 into circularly polarized light. On the other hand, the quarter-wavelength plate 113 turns the circularly polarized light having been transmitted through the mask Ma into linearly polarized light (p-polarized light). The polarization beam splitter 112 allows the linearly polarized light (p-polarized light) transmitted through the quarter-wavelength plate 113 to pass through to the imaging unit.

The polarization beam splitter 112 is also positioned on the optical path that illuminates the mask Ma with reflected light, to reflect linearly polarized light (s-polarized light) reflected by the polarization beam splitter 107 toward the mask Ma. The quarter-wavelength plate 113 is also positioned on the optical path that illuminates the mask Ma with reflected light, to turn the linearly polarized light (s-polarized light) reflected by the polarization beam splitter 112 into circularly polarized light. The circularly polarized light reflected by the mask Ma is transmitted through the quarter-wavelength plate 113 again and thus turned into linearly polarized light (p-polarized light) with a polarization direction rotated through 90 degrees. Then, the light is transmitted through the polarization beam splitter 112 and travels to the imaging unit.

The transmission TDI sensor 118 and the reflective TDI sensor 119 electrically accumulate faint enlarged optical images of the mask Ma provided by the image-forming optical system. The transmission TDI sensor 118 and the reflective TDI sensor 119 convert the enlarged optical image into an image electric signal as optical image data and output the image electric signal. The transmission TDI sensor 118 and the reflective TDI sensor 119 are area sensors in which a plurality of exposure areas are arranged in an integration direction in which charge is accumulated. To allow the optical image of the mask Ma to be imaged, the transmission TDI sensor 118 and the reflective TDI sensor 119 transfer the charge on an area-to-area basis in the integration direction each time the mask Ma is scanned, and accumulate the charge corresponding to the integration areas to output the resultant charge. Consequently, even when the charge for one line is faint, a plurality of additions of the charge provide an output with an amount of light comparable to several tens of times as large as the amount of light obtained without additions. A plurality of additions of the charge for one point reduces noise to increase the S/N ratio of image signals.

The inspection apparatus 100 further includes an optical image acquisition unit 121 to which optical image data output from the sensor circuit 120 is input, a reference image generating unit 124 that generates reference image data serving as a model for the optical image data, and a comparing unit 133 that compares the optical image data with the reference image data based on a Die to Database comparing scheme to detect possible defects in the mask Ma.

The comparing unit 133 is an example of a defect detecting unit in the embodiments. The inspection apparatus 100 may detect possible defects based on the Die to Die comparing scheme. In that case, optical image data input to the optical image acquisition unit 121 are compared with each other. The optical image acquisition unit 121 may also serve as the defect detecting unit, or the defect detecting unit may be provided separately from the optical image acquisition unit 121 to receive optical image data from the optical image acquisition unit 121.

The inspection apparatus 100 further includes a tone correction unit 132 that acquires a transmissivity distribution of light transmitted through the mask Ma from the optical image data acquired by the optical image acquisition unit 121, to correct a tone of the optical image data, a line width error acquisition unit 122 that acquires a line width error in the mask Ma from the corrected optical image data, and a map generating unit 123.

Besides the above-described components, the inspection apparatus 100 includes a magnetic disk device 125 that serves as an example of a storage device, a magnetic tape device 126 that serves as an example of an auxiliary storage device, a flexible disk device 127 that serves as another example of an auxiliary storage device, a monitor display 128 that serves as an example of a display device, a microscope pattern monitor 129 that serves as another example of a display device and that includes an ITV camera, and a printer 130. These components are connected to a total controller 140 that acts to control the inspection apparatus 100 as a whole, via a bus 131 serving as a data transmission path. The above-described table controller 103 and position information unit 104 are connected to the total controller 140 via the bus 131.

The inspection apparatus 100 is configured as described above to detect possible defects in an inspection target pattern of the mask Ma and to acquire a line width error in the inspection target pattern to create a ΔCD map.

An example of an inspection method according to the present embodiment will be described.

Figure 2:
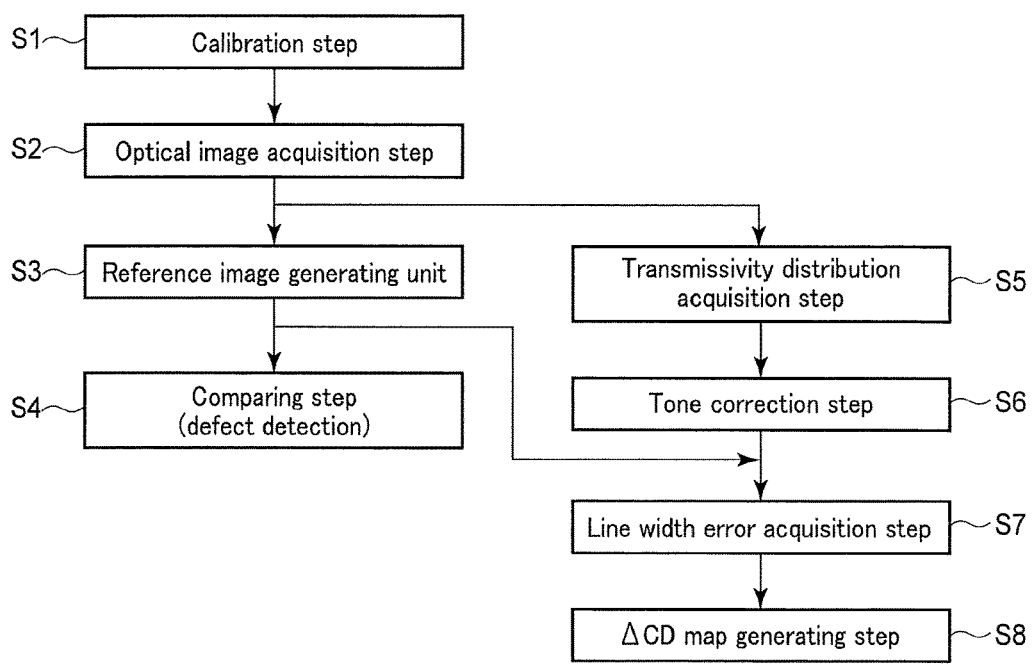
FIG. 2 is a flowchart illustrating an example of an inspection method in Embodiment 1.

FIG. 2 is a flowchart illustrating an example of the inspection method according to the present embodiment. As illustrated in FIG. 2, the inspection method according to the present embodiment includes a calibration step S1, an optical image data acquisition step S2, a reference image data generating step S3, a comparing step S4, a transmissivity distribution acquisition step S5, a tone correction step S6, a line width error (ΔCD) acquisition unit S7, and a ΔCD map generating step S8. Now, the steps will be described with reference to FIG. 1 and FIG. 2.

<Calibration Step S1>

The TDI sensor includes a set of a large number of sensor elements, and a possible variation in sensor characteristics among the sensor elements causes malfunction. Thus, all the sensor elements need to have electrically equal characteristics (gain and offset characteristics). Thus, the transmission TDI sensor 118 and the reflective TDI sensor 119 are calibrated before an optical image is acquired in order to allow detection of possible defects and acquisition of a line width error. The calibration is performed, for example, as follows.

An optical image taken by the transmission TDI sensor 118 is input to a digital amplifier (not depicted in the drawings) provided in the sensor circuit 120 to enable offset and gain adjustment to be executed on each pixel. The calibration is a step of determining the gain for each pixel in the digital amplifier. In the calibration of the transmission TDI sensor 118, first, the transmission TDI sensor 118 is positioned in a transmitted light area of the mask Ma that is sufficiently large compared to an imaged area. Then, conditions (for example, the output of the light source, the amount of light, and the positions of mirrors and lenses) for the illuminating optical system that illuminates the mask Ma are set the same as the conditions for the inspection, and an optical image of the mask Ma is taken. The tone of the taken optical image is acquired to determine a white level. Then, the amount of light for illumination of the mask Ma is set to zero. The tone of the taken optical image is acquired to determine a black level. At this time, to allow for a variation in the amount of light during inspection, offset and gain are adjusted for each pixel such that, for example, the amplitudes of the white level and the black level are distributed between 10 and 240 corresponding to approximately 4% to 9% of 8-bit tone data.

An optical image taken by the reflective TDI sensor 119 is also input to the digital amplifier of the sensor circuit 120. Consequently, the gain for each pixel in the digital amplifier is determined by calibration similar to that described above.

<Optical Image Data Acquisition Step S2>

The mask Ma placed on the table 101 is fixed to the table 101 using a device such as a vacuum chuck. To allow possible defects in the pattern formed on the mask Ma to be accurately detected and to allow accurate location of a defect, the pattern of the mask Ma needs to be aligned with a predetermined position on the table 101. Specifically, with the mask Ma placed on the table 101, the X axis and the Y axis of the measurement pattern are aligned with traveling axes of the XY table. Thus, for example, an alignment mark is formed on the mask Ma, and an image of the alignment mark is taken by the inspection apparatus 100. The pattern of the mask Ma is aligned on the table 101. Alternatively, the mask alignment mark may be omitted, and alignment may be achieved using a vertex of a corner or a side of an edge pattern that is included in the pattern of the mask Ma and that is as close to an outer periphery of the mask Ma as possible and that has the same XY coordinates.

When the mask Ma is fixed to a predetermined position on the table 101, the pattern provided on the mask Ma is irradiated with light from the light source 105 via the illuminating optical system. Specifically, a flux radiated from the light source 105 passes through the half-wavelength plate 106 and is then branched by the polarization beam splitter 107 (first polarization beam splitter) into an optical path that illuminates the mask Ma with transmitted light and an optical path that illuminates the mask Ma with reflected light. In FIG. 1, transmitted illumination light is depicted by a solid line, and reflected illumination light is depicted by a dotted line.

P-polarized light contained in the linearly polarized light emitted from the light source 105 is transmitted through the polarization beam splitter 107 and turned into circularly polarized light by the quarter-wavelength plate 108. The circularly polarized light is then radiated to the mask Ma. The circularly polarized light is transmitted through the mask Ma, passes through the objective lens 114, and is turned into linearly polarized light again by the quarter-wavelength plate 113. Subsequently, after being transmitted through the polarization beam splitter 112 (second polarization beam splitter), the linearly polarized light enters the transmission TDI sensor 118 via the mirrors 115 and 116.

On the other hand, s-polarized light contained in the linearly polarized light emitted from the light source 105 is reflected by the polarization beam splitter 107 and enters the polarization beam splitter 112 via the mirror 110 and the half-wavelength plate 111. The polarization beam splitter 112 reflects s-polarized light, and thus, the reflected s-polarized light is transmitted through the quarter-wavelength plate 113 and turned from the linearly polarized light into circularly polarized light, which is radiated to the mask Ma through the objective lens 114. Light reflected by the mask Ma is transmitted through the objective lens 114 and the quarter-wavelength plate 113 again. Consequently, the circularly polarized light is turned into linearly polarized light, and the polarization direction of the light is rotated through 90 degrees to change the s-polarized light into p-polarized light, which is thus transmitted through the polarization beam splitter 112. The light then enters the reflective TDI sensor 119 via the mirrors 115 and 117.

As described above, the polarization beam splitter 112 is arranged on the optical path of the light transmitted through the mask Ma so that the light reflected by the polarization beam splitter 107 is reflected by the polarization beam splitter 112 to illuminate the mask Ma. In other words, an optical image of the inspection target pattern of the mask Ma based on transmitted illumination can be taken by the transmission TDI sensor 118, while an optical image of the same inspection target pattern based on reflected illumination can be taken by the reflective TDI sensor 119.

The following description relates to a method for taking optical images of the pattern of the mask Ma using the transmission TDI sensor 118 and the reflective TDI sensor 119 (method for acquiring optical image data). In the description of this imaging method, the transmission TDI sensor 118 and the reflective TDI sensor 119 are not distinguished from each other and are simply referred to as the TDI sensor.

The inspection target area of the mask Ma is virtually divided into a plurality of strip-like areas. The strip-like areas are referred to as stripes. Each of the stripes is an area having a width of several hundred μm and a length of approximately 100 mm corresponding to the overall length of the inspection target area in the X direction.

For each stripe, a plurality of grid-like imaging target units into which the stripe is divided are set (the individual imaging target units are hereinafter referred to as "frames"). The size of each of the frames corresponds to a square equal to the width of the stripe or approximately one-fourth of the width of the stripe on a side.

Figure 3:
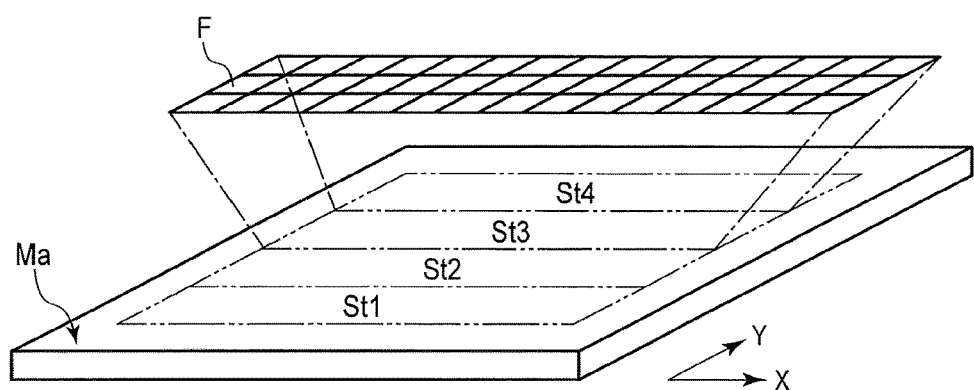
FIG. 3 is a conceptual drawing illustrating a relation between an inspection target area of a mask and stripes and frames.

FIG. 3 is a conceptual drawing illustrating the relation between the inspection target area of the mask Ma and the stripes and frames. In this example, the inspection target area is virtually divided into four stripes St1 to St4, and 45 frames F are virtually set in each of the stripes St1 to St 4.

The stripes St1 to St4 are shaped like strips that are elongate in the X direction and are aligned in the Y direction. On the other hand, each of the frames is shaped like a rectangle of 10 or about 10 μm on a side. To prevent lack of imaging, the frames are set such that an edge of one of two adjacent frames overlaps an edge of the other over a predetermined distance. The predetermined distance may be equal to 20 pixels when the predetermined distance is based on a pixel size for the TDI sensor. The stripes are similarly set such that an edge of one of two adjacent stripes overlaps an edge of the other.

An optical image of the mask Ma is taken for each stripe. That is, when optical images are taken in the example in FIG. 3, the operation of the table 101 is controlled so as to allow the stripes St1, St2, St3, and St4 to be consecutively scanned. Specifically, first, while the table 101 is being moved in a −X direction in FIG. 3, optical images of the stripe St1 are taken in order and consecutively input to the TDI sensor. When all of the optical images of the stripe St1 are taken, optical images of the stripe St2 are taken. At this time, after being moved in steps in a −Y direction, the table 101 is moved in a direction (X direction) opposite to the direction (−X direction) in which the table 101 is moved when the optical images of the stripe St1 are taken. The taken optical images of the stripe St2 are also consecutively input to the TDI sensor. When optical images of the stripe St3 are taken, the table 101 is moved in steps in the −Y direction and then in the direction (−X direction) opposite to the direction (X direction) in which the table 101 is moved when the optical images of the stripe St2 are taken. Similarly, optical images of the stripe St4 are taken.

In FIG. 1, when the transmission TDI sensor 118 and the reflective TDI sensor 119 take the optical images of the pattern of the mask Ma, that is, convert the optical images of the pattern into electric signals to acquire optical image data, analog signals for the optical image data are sequentially output to the sensor circuit 120. The sensor circuit 120 converts the analog signals output by the transmission TDI sensor 118 and the reflective TDI sensor 119 into digital signals. The sensor circuit 120 outputs the optical image data to the optical image acquisition unit 121.

<Reference Image Data Generating Step S3>

In the reference image data generating step S3 in FIG. 2, the reference image generating unit 124 in FIG. 1 generates reference image data based on design pattern data on the mask Ma. The reference image data is used as a reference for defect determination for the optical image data in inspection based on the Die to Database comparing scheme in the comparing step S4. Also in the line width error (ΔCD) acquisition step S7 (described below), the reference image data is used to calculate a line width used as a reference for acquisition of a line width error in the pattern of the mask Ma.

FIG. 4 illustrates an example of a flow of data in the inspection apparatus 100 in FIG. 1.

The design pattern data on the mask Ma is stored in the magnetic disk device 125. The design pattern data is read out to the total controller 140, which then sends the design pattern data to the reference image generating unit 124 as depicted in FIG. 4. The reference image generating unit 124 includes an extracting circuit 124a and a reference circuit 124b. Upon receiving the design pattern, the extracting circuit 124a converts the design pattern data into binary or multilevel image data. The image data is then sent from the extracting circuit 124a to the reference circuit 124b. The reference circuit 124b executes appropriate filtering on the image data. The reason for the filter processing is as follows.

In general, for the mask pattern, roundness of corners and the finished dimension of the line width are increased or reduced during a manufacturing process. Thus, the mask pattern fails to completely match the design pattern. Furthermore, for example, the optical image data output from the sensor circuit 120 is blurred due to the resolution characteristics of the optical system, aperture effects of the transmission TDI sensor 118 and the reflective TDI sensor 119, or the like, in other words, subjected to the action of a spatial low pass filter.

Thus, based on the design pattern data and the optical image data for the mask Ma, a reference image generation function is determined which simulates the manufacturing process for the mask Ma and changes made by the optical system of the inspection apparatus 100. The inspection apparatus 100 uses the reference image generation function to execute processing in which two-dimensional digital filtering is applied to the design pattern data to make the design pattern data similar to the optical image data with respect to the reference image data. In the present embodiment, the reference circuit 124b executes filtering using the reference image generation function on the image data output from the extracting circuit 124a, to generate reference image data.

<Comparing Step S4>

In the comparing step S4 in FIG. 2, the optical image data was compared with the reference image data to detect possible defects in the pattern of the mask Ma. This step is executed by the comparing unit 133 in FIG. 13.

The comparing unit 133 divides the optical image data output from the optical image acquisition unit 121 into data with a predetermined size, for example, data for each frame. The reference image data output from the reference image generating unit 124 is also divided into data for each frame corresponding to the optical image data. Each of the pieces of optical image data for the respective frames resulting from the division is referred to as "optical frame data". Each of the pieces of reference image data for the respective frames resulting from the division is referred to as "reference frame data".

As described below in detail, the comparing unit 133 compares the optical frame data with the reference frame data to detect possible defects in the optical frame data. The position information unit 104 sends measured data from the laser measuring system 102 to the comparing unit 133, which creates defect position coordinate data using the measured data.

The comparing unit 133 is equipped with several tens of comparing units. This allows a plurality of optical frame data to be processed simultaneously and in parallel with the corresponding reference frame data. Upon completing processing of one optical frame data, each of the comparing units loads unprocessed optical frame data and the corresponding reference frame data. As described above, a large number of optical frame data are sequentially processed to allow possible defects to be detected.

The processing in the comparing units is specifically executed as follows.

First, a set of optical frame data and reference frame data corresponding to the optical frame data is output to each of the comparing units. In the comparing unit, the optical frame data is aligned with the reference frame data (frame alignment). At this time, in order to align the edge positions of a pattern and the peak position of brightness, parallel shifting in units of pixels is performed in the TDI sensor (118 and 119), and components smaller than pixels are also calibrated by, for example, proportional distribution of brightness values of neighborhood pixels.

After the alignment between the optical frame data and the reference frame data is completed, possible defects are detected in accordance with an appropriate comparison algorithm. For example, a difference in level between the optical frame data and the reference frame data is evaluated for each pixel, and differential values of pixels in a pattern edge direction are compared with each other. When the difference between the optical image data and the reference image data exceeds a predetermined threshold, the corresponding position is determined to be a defect.

For example, a threshold for registration of a line width defect is specified in units of a dimensional difference (nm) in line width CD between the optical image data and the reference image data and the dimensional ratio (%) of the line width CD in the optical image data to the line width CD in the reference image data. Two thresholds are specified; for example, the dimensional difference in line width is 16 nm, and the dimensional ratio of the line width is 8%. When the pattern in the optical image data has a line width of 200 nm, if the dimensional difference from the reference image data is 20 nm, the values are larger than the threshold for the dimensional difference and the threshold for the dimensional ratio, respectively. Thus, the pattern is determined to be defective.

The threshold for defect determination may be separately specified for the case where the line width is larger than that in the reference image data and for the case where the line width is smaller than that in the reference image data. The threshold may be separately specified for the case where, instead of the line width, the space width between lines (the distance between patterns) is larger than that in the reference image data and for the case where the space width is smaller than that in the reference image data. Moreover, for a hole-shaped pattern, a threshold for the dimension of a hole diameter and a threshold for the dimensional ratio of diameters may be specified. In this case, the threshold may be separately specified for a section of the hole in the X direction and for a section of the hole in the Y direction.

Examples of the algorithm used for defect detection include, besides the above-described algorithm, level comparison and differential comparison. The level comparison involves, for example, calculation of the brightness value of each pixel in the optical frame data, that is, the brightness value of an area corresponding to each value in the TDI sensor (118 and 119). The calculated brightness value is compared with the corresponding brightness value in the reference frame data to allow possible defects to be detected. The differential comparison involves differential determination of the amount of change in the brightness value of each pixel in a direction along the edges of a fine pattern on the optical frame data; for example, in a direction along the edges of a line pattern. The amount of change is compared to the corresponding amount of change in brightness value in the reference frame data to allow possible defects to be detected.

When the comparing unit 133 determines that the optical frame data has a defect, information on the defect such as the corresponding optical frame data, position coordinate data on the defect, and the compared reference frame data is registered in the magnetic disk device 125.

For each set of optical frame data and the corresponding reference image data and for each comparison algorithm, the comparing unit 133 performs a series of comparison and determination operations including alignment of the frame data, defect detection, and aggregation of the number of detected defects, a plurality of times with alignment conditions for the frame data changed. The comparing unit 133 may then register the results of the defect detection in the comparison and determination operations with the smallest number of detected defects.

As described above, the comparing unit 133 sequentially loads optical image data and reference image data to compare the data with each other, detecting possible defects in each optical image data.

In FIG. 2, steps S1 to S4 correspond to steps of detecting possible defects in the inspection target pattern of the mask Ma. On the other hand, steps S1 to S3 and S5 to S8 correspond to steps of acquiring a line width error in the inspection target pattern of the mask Ma to create a ΔCD map. Now, steps S5 to S8 will be described.

<Transmissivity Distribution Acquisition Step S5>

In the configuration of the optical system depicted in FIG. 1, the polarization beam splitters 107 and 112 are arranged on the optical path of light transmitted through the mask Ma, and the mask Ma is illuminated with light transmitted through the polarization beam splitter 107. The mask Ma is illuminated with light reflected by the polarization beam splitter 107 and further reflected by the polarization beam splitter 112. Therefore, this configuration allows simultaneous execution of transmitted illumination and reflected illumination of the mask Ma to allow simultaneous taking of an optical image based on transmitted illumination and an optical image based on reflected illumination. In other words, an optical image of the inspection target pattern of the mask Ma based on transmitted illumination can be taken by the transmission TDI sensor 118, while an optical image of the same inspection target pattern based on reflected illumination can be taken by the reflective TDI sensor 119.

A glass substrate such as quartz forming the mask Ma exhibits birefringence, and the directions of the birefringence vary with position. Thus, the polarization state of light changes at the time of transmission through the mask Ma. Therefore, the amount of light transmitted through the polarization beam splitter 112 decreases.

Figure 5:
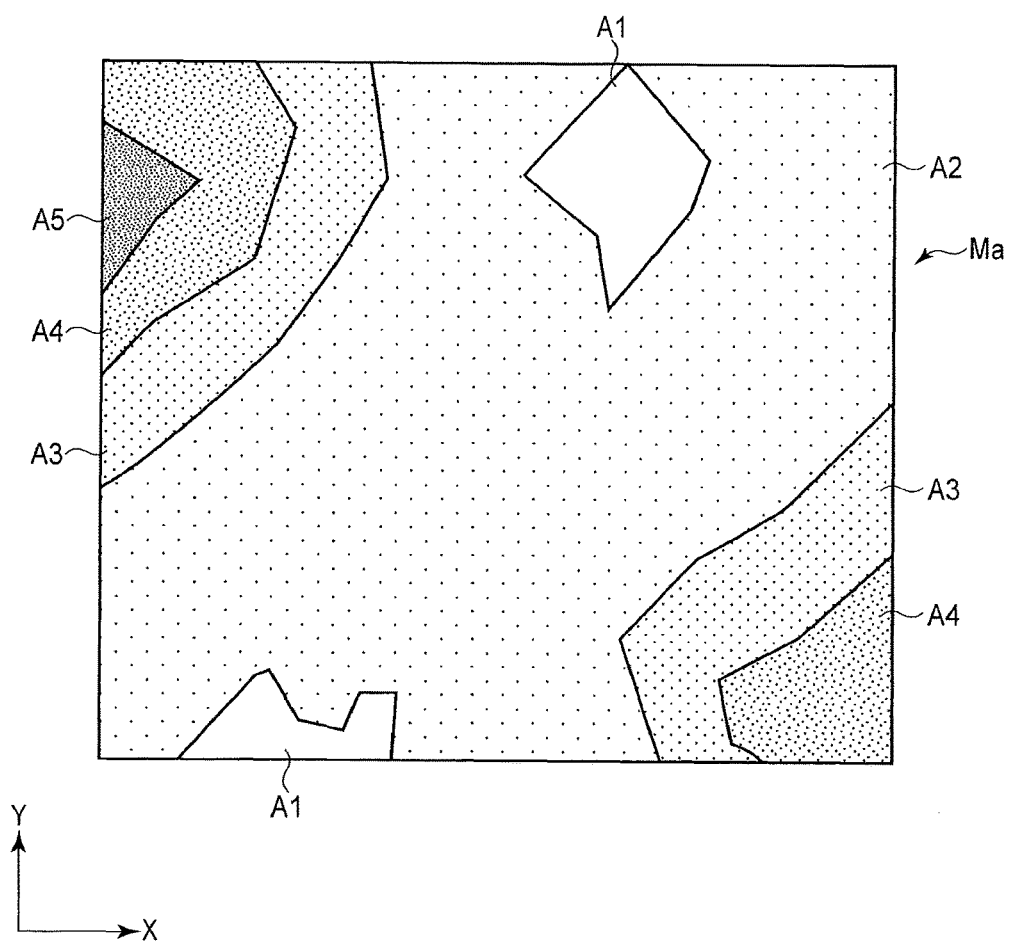
FIG. 5 is a schematic diagram illustrating the distribution of the amount of light transmitted through a polarization beam splitter in FIG. 1 in relation to a mask.

FIG. 5 is a schematic diagram of the distribution of the amount of light transmitted through the polarization beam splitter 112 in FIG. 1 in relation to the mask Ma. In FIG. 5, the horizontal axis corresponds to a position on the mask Ma in the X-axis direction, and the vertical axis corresponds to a position on the mask Ma in the Y-axis direction.

When the mask Ma is illuminated with light emitted from the light source 105, the amount of light is to be the same at any position on the mask Ma. However, the different directions of the birefringence in the surface of the mask Ma (light incident surface) result in an actual light amount distribution as illustrated in FIG. 5. In the example in FIG. 5, the amount of light varies among areas A1 to A5. The area A1 is brightest and the brightness decreases in the order of area A2, A3, A4, and A5. This light amount distribution is correlated with a transmissivity distribution for light transmitted through the mask Ma.

Given the amount of light in the area A2 has a value that is to be obtained at any position on the mask Ma when the apparatus is not affected by birefringence, the measured value of the line width is larger than the actual value in the area A1 involving a larger amount of light than the area A2. On the other hand, in the areas A3, A4, and A5 involving a smaller amount of light than the area A2, the measured value of the line width is smaller than the actual value. Of the areas A1 to A5, the area A5 involves the smallest line width. In other words, given the line width of the inspection target pattern on the mask Ma has a value as designed at any position on the mask Ma, the line width error is to be zero. However, the measured value of the line width in the area A1 is larger than the actual value, and thus, the line width error has a positive value. On the other hand, since the measured value of the line width in each of the areas A3, A4, and A5 is smaller than the actual value, the line width error has a negative value. The difference between the line width error determined from the measured value and the actual line width error (in this case, zero) increases in the order of area A3, A4, and A5.

The transmissivity for light transmitted through the mask Ma has a distribution as depicted in FIG. 5. In the present embodiment, the transmissivity distribution for light transmitted through the mask Ma is acquired from the optical image data acquired in the optical image acquisition step S2.

Specifically, the acquisition is performed as follows. If the transmissivity is the same for any portion on the mask Ma, the contrast of the optical image data depends on the presence of a pattern. However, when the transmissivity is distributed in the surface of the mask Ma, the amount of light incident on the transmission TDI sensor 118 and the reflective TDI sensor 119 in FIG. 1 varies in accordance with the transmissivity distribution. In other words, when the pattern of the mask Ma is not taken into account, a large amount of light is incident on the sensors at portions with high transmissivity. However, a small amount of light is incident on the sensors at portions with low transmissivity. Therefore, the contrast of the optical image data not only depends on the presence of a pattern but also varies in accordance with the transmissivity distribution. Thus, for example, a comparison of the tone with a portion with no pattern allows the distribution of transmissivity to be determined.

In the present embodiment, a plurality of portions with no pattern in the inspection target area on the mask Ma are selected, that is, a plurality of portions where the glass substrate is exposed are selected, and the transmissivity is determined for the portions. Then, based on the transmissivity for the extracted portions, the transmissivity distribution is estimated for the entire inspection target area. Specifically, in FIG. 1, the optical image acquisition unit 121 sends an optical image to the tone correction unit 132. The tone correction unit 132 acquires the transmissivity for pre-specified portions in the inspection target area on the mask Ma. Then, the tone correction unit 132 estimates the transmissivity distribution for the inspection target area on the mask Ma based on the acquired transmissivity.

For example, five portions with no pattern are selected in the inspection target area on the mask Ma along the X direction. For each of the portions, five portions with no pattern are similarly selected along the Y direction. In this manner, a total of 25 portions with no pattern are extracted as measured portions. At this time, the size of each measured portion is equal to or larger than the diameter (2r) of an airy disc in a diffraction image of light. The diameter of the airy disc is obtained using Equation (1). The wavelength of light is denoted by λ, and the numerical aperture of the image-forming optical system is denoted by NA.

$$2r = 1.22 \times \frac{\lambda}{NA} \quad (1)$$

For example, the inspection target is assumed to be a mask for a device with a half pitch of 20 nm or less. In this case, the light source 105 in FIG. 1 suitably has a wavelength close to 193 nm, which is used for photolithography. For example, a pulse laser that emits ultraviolet light with a wavelength of 199 nm may be used. For an inspection apparatus that needs to have a high resolution, the image-forming optical system has a numerical aperture NA, for example, of 0.80. Thus, when λ=199 and NA=0.80, the diameter is determined to be approximately 0.3 μm in accordance with Equation (1). In other words, for example, 25 areas are extracted each of which has a diameter of 0.3 μm or more and from each of which the glass substrate is exposed. The transmissivity of each area is then acquired.

An example of an extraction method for portions for which the transmissivity is acquired will be described using FIG. 9.

First, the inspection target pattern area is divided into a plurality of subareas (S101). For example, the inspection target pattern area is divided into five subareas in each of the X-axis direction and the Y-axis direction to form 25 subareas.

Then, a predetermined position is extracted (S102), and the apparatus determines whether or not the predetermined position has a pattern (S103). When the predetermined position has no pattern, the apparatus determines whether or not the size of the portion with no pattern is equal to or larger than the diameter of the airy disc (S104). When the size of the position with no pattern is equal to or larger than the diameter of the airy disc, the transmissivity of the mask Ma is acquired at the predetermined position (S105). Subsequently, the apparatus moves to the next subarea.

When, in S103, the predetermined position is determined to have a pattern, or in S104, the size of the portion with no pattern is determined not to be equal to or larger than the diameter of the airy disc, the apparatus determines whether or not any pattern is present within a range r of distance from the predetermined position. When the predetermined position has no pattern, the apparatus determines whether or not the size of the portion with no pattern is equal to or larger than the diameter of the airy disc (S107). When the size of the position with no pattern is equal to or larger than the diameter of the airy disc, the transmissivity of the mask Ma is acquired at a portion closest to the predetermined position. Subsequently, the apparatus moves to the next subarea.

When, in S106, no portion with no pattern is present within the range r of distance from the predetermined position, or in S107, the size of the portion with no pattern is determined not to be equal to or larger than the diameter of the airy disc, the apparatus moves to the next subarea rather than acquiring the transmissivity.

After movement to the next subarea following step S105, S108, or S106 or S107, the apparatus returns to S102 to repeat the above-described steps.

When no portion having no pattern and having an area equal to or larger than the diameter of the airy disc is present in the inspection target area on the mask Ma or the number of such portions is not sufficient to estimate the transmissivity distribution, the transmissivity is acquired for portions outside the inspection target area; for example, four corners of the mask Ma.

After the transmissivity is acquired for the predetermined portions, the transmissivity distribution for the entire inspection target area on the mask Ma is estimated. The estimation of the transmissivity distribution may be performed as follows. A stress distribution for the mask Ma has a predetermined tendency, and the directions of birefringence have the corresponding tendency. Thus, when circularly polarized light enters the mask Ma, circularly polarized light has its polarization characteristics varied according to the directions of birefringence in the surface of the mask Ma. Specifically, the polarization characteristics of incident light are maintained near the center of the mask Ma, but a direction in which the transmissivity decreases and a direction in which the transmissivity increases appear symmetrically toward peripheral portions. Determination of the polarization characteristics of polarization through the surface of the mask Ma allows the transmissivity distribution for the entire inspection target area based on the transmissivity of a predetermined number of measured portions.

<Tone Correction Step S6>

The tone correction unit 132 further corrects the tone of the optical image data for which the transmissivity has been acquired, using the transmissivity distribution obtained in the transmissivity distribution acquisition step S5. Specifically, the tone correction unit 132 corrects the tone of the optical image data so as to eliminate variations in the contrast of the optical image data which correspond to the transmissivity distribution.

For example, in FIG. 5, the tone correction unit 132 corrects and reduces the tone of the optical image data acquired for the area A1 so as to make the tone of the optical image data for the area A1 the same as the tone of the optical image data acquired for the area A2. On the other hand, the tone correction unit 132 corrects and increases the tones of the optical image data acquired for the areas A3, A4, and A5 so as to make the tones of the optical image data for the areas A3, A4, and A5 the same as the tone of the optical image data acquired for the area A2. The tone of the optical image data acquired for the area A2 is not corrected.

<Line Width Error Acquisition Step S7>

In the inspection apparatus 100 in FIG. 1, the optical image data corrected by the tone correction unit 132 is used to acquire a line width error (ΔCD) in the inspection target pattern of the mask Ma. The line width error acquisition step S7 is specifically executed as follows.

First, the tone correction unit 132 sends the corrected optical image data to the line width error acquisition unit 122. The reference image generating unit 124 also sends the reference image data to the line width error acquisition unit 122. The line width error acquisition unit 122 first detects, in the optical image data and the reference image data, an edge pair serving as a reference for measurement of the line width (CD).

For detection of the edge pair, first, edge positions serving as reference positions are determined. A well-known threshold method is used for this determination. For example, any value (threshold Th) is designated which falls between the signal amount (light intensity) of a black level and the signal amount (light intensity) of a white level in the reference image data. The signal amount may refer to the transmissivity for light. The threshold Th refers to a value corresponding to a predetermined ratio according to which the range between the minimum value and maximum value of the signal amount is internally divided. In the reference image data, positions corresponding to the signal amount of the threshold Th are designated as edge positions. Further, as regards the optical image data, positions corresponding to the signal amount equal to the threshold Th are designated as edge positions. In other words, of the optical image data, the positions corresponding to the signal amount equal to the threshold Th represent edges of the pattern. For example, when the inspection target is a line and space pattern, the threshold corresponds to the boundary between a line pattern and a space pattern.

Location of edges of the pattern allows an edge pair to be detected. That is, the edge pair includes one of the detected edges that serves as a start point for line width measurement and one of the detected edges which serves as an end point for line width measurement. The edge pair is detected, for example, in units of pixels. For example, for a line pattern in which two edges extend in the Y direction, an edge pair is detected on both edges in units of pixels. Further, for a line pattern in which two edges extend in the X direction, an edge pair is detected on both edges in units of pixels.

In the inspection apparatus 100 in FIG. 1, the line width error acquisition unit 122 detects an edge pair. The position information unit 104 sends measured values of position coordinates of the table 101 measured by the laser measuring system 102 to the line width error acquisition unit 122. Based on the measured values, the line width error acquisition unit 122 determines the position coordinates of each edge. Specifically, the line width error acquisition unit 122 performs the following operation. First, optical image data acquired in units of stripes is divided into data each with a predetermined size, for example, data for the respective frames. Then, a predetermined area in the optical image data is compared with a reference image data corresponding to the predetermined area. Based on pattern matching, the table 101 is translated to a position where the absolute value of a difference between the image data or the square sum of differences, is minimized. The position coordinates of the measurement pattern are determined based on the amount of the translation and data from the laser measuring system 102 printed in the frame. The position coordinates of the edges can then be determined.

Once an edge pair is detected, the line width error acquisition unit 122 continues to acquire a line width error (ΔCD). The line width error is obtained by determining the difference between the line width Wref of the pattern in the reference image data and the line width Wopt of the pattern in the optical image data corresponding to the reference image data.

For example, a line and space pattern is assumed in which line patterns each with two edges extending in the Y direction are arranged at predetermined intervals (spaces) in the X direction. The line width error is measured for each of the line width of the line pattern and the line width of the space pattern. Specifically, first, the line width of each line pattern and the line width of each space pattern are measured using the detected edge pair.

FIG. 7 is a partial plan view of a line and space pattern that is an example of the measurement pattern. In FIG. 7, shaded portions represent line patterns, and portions each provided between the line patterns represent space patterns. For example, at the same position in the line patterns in the Y direction, line widths W12, W14, . . . are measured in the X direction. Similarly, for the space patterns, line widths W11, W13, W15, . . . are measured in the X direction. Then, at the same position in the line patterns in the Y direction which position is displaced from the above-described same position by one pixel in the −Y direction, line widths W22, W24, . . . are measured in the X direction. Similarly, for the space patterns, line widths W21, W23, W25, . . . are measured in the X direction.

Figure 8:
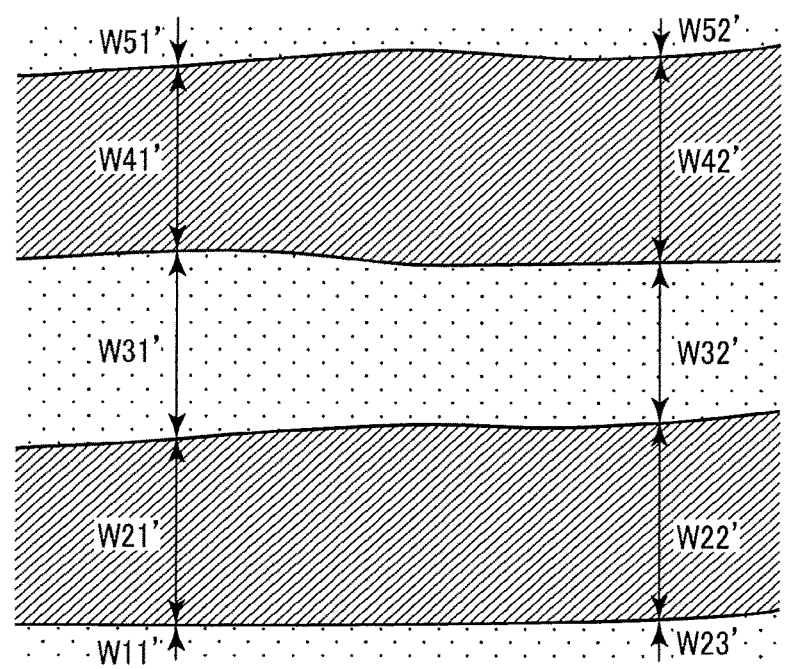
FIG. 8 is a partial plan view of another example of a line and space pattern.

FIG. 8 is a partial plan view of a line and space pattern. In FIG. 8, shaded portions represent line patterns, and portions each provided between the line patterns represent space patterns, as in the case of FIG. 7. In the example in FIG. 8, line patterns each with two edges extending in the X direction are arranged at predetermined intervals (spaces) in the Y direction. Also in this case, the line width error is measured for each of the line width of the line pattern and the line width of the space pattern. That is, the line width of each line pattern and the line width of each space pattern are measured using the detected edge pair.

Specifically, at the same position in the line patterns in the X direction, line widths W21', W41', . . . are measured in the Y direction. Similarly, for the space patterns, line widths W11', W13', W15', . . . are measured in the Y direction. Then, at the same position in the line patterns in the Y direction which position is displaced from the above-described same position by one pixel in the X direction, line widths W22', W42', . . . are measured in the Y direction. Similarly, for the space patterns, line widths W23', W32', W52', . . . are measured in the Y direction.

The line width of each pattern measured as described above is compared with the line width obtained using the corresponding edge pair in the reference image data to determine the difference between the line widths. The difference obtained is the line width error (ΔCD). The line width error is determined for each frame. In the examples in FIG. 7 and FIG. 8, for each frame and for the line patterns, the line width error in the X direction and the line width in the Y direction are determined using the measured values of the line widths. Similarly, for the space patterns, the line width error in the X direction and the line width in the Y direction are determined using the measured values of the line widths.

Figure 6:
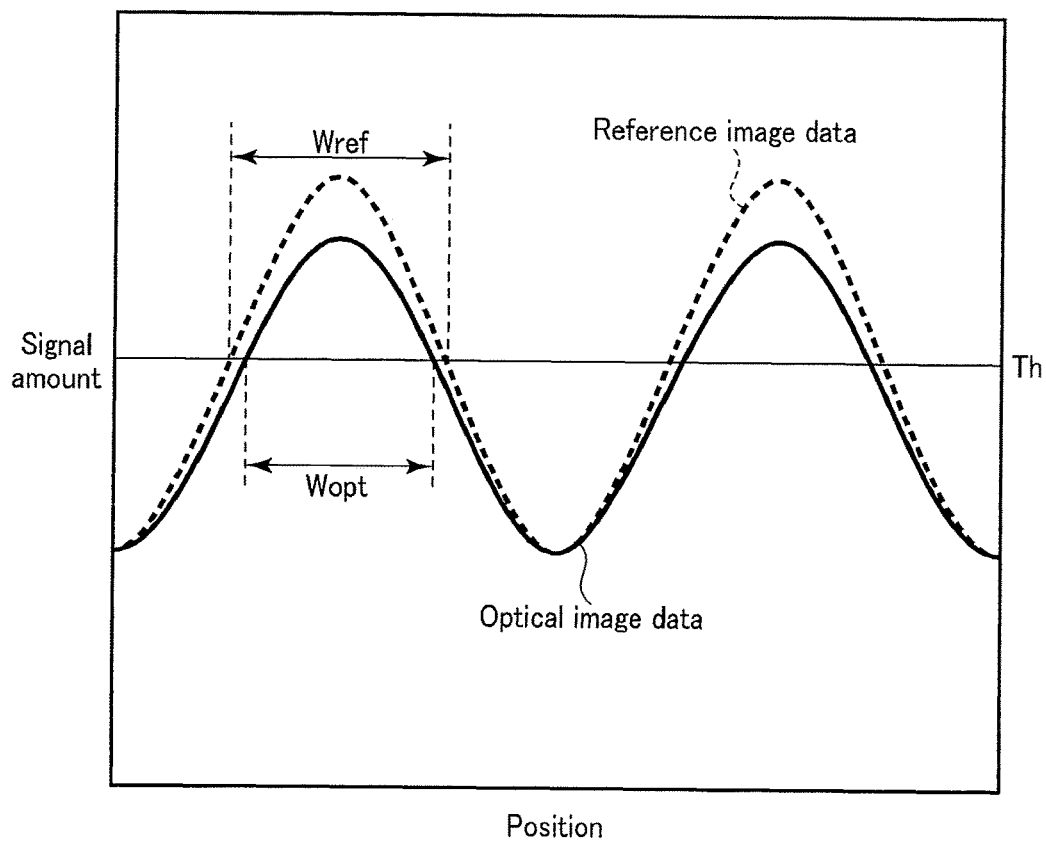
FIG. 6 is a diagram illustrating an example of the signal amount of optical image data acquired by a transmission TDI sensor in FIG. 1.

FIG. 6 illustrates an example of the signal amount of optical image data acquired by the transmission TDI sensor 118. The horizontal axis in FIG. 6 represents a position on the transmission TDI sensor 118. The vertical axis in FIG. 6 represents the signal amount of optical image data, which is correlated with the light intensity of light incident on the transmission TDI sensor 118. In this figure, a dotted curve represents reference image data. The threshold Th that determines the edge positions of a pattern is determined based on the reference image data. For example, based on the dotted reference image data illustrated in FIG. 6, the threshold Th is determined by Equation (2).

$$Th = \frac{\left(\begin{array}{l}\text{(maximum value of signal amount)} - \\ \text{(minimum value of signal amount)}\end{array}\right)}{2} \quad (2)$$

Determination of the threshold Th determines the edge positions of the pattern and thus the line width Wref of the pattern. The line width Wref corresponds to the design value of the line width of the pattern. The line width error (ΔCD) is obtained by determining the difference between the design value and the line width in the optical image data corresponding to the actual pattern (inspection target pattern).

The reference image data serves as a model for the optical image data. Therefore, if each pattern is formed in accordance with design values, the optical image data is to match the reference image data, and the line width of the pattern in the optical image data is to be equal to the line width Wref.

As described above, the substrate forming the mask Ma exhibits birefringence. Since the directions of the birefringence vary with position, the polarization state of light changes at the time of transmission through the mask Ma. Thus, the amount of light transmitted through the polarization beam splitter 112 decreases, and the amount of light incident on the transmission TDI sensor 118 also decreases. The signal amount of the optical image data for the corresponding portion is as indicated by a solid curve in FIG. 6. Therefore, when the edge positions of the pattern in the optical image data are determined using the threshold Th, the line width Wopt is obtained, and the line width error ΔCD (Wopt−Wref) is found. In other words, the line width of the pattern determined based on the optical image data is originally to be equal to Wref, resulting in a line width error of zero. However, apparently, the resultant line width is (Wopt−Wref). Thus, an accurate line width error is precluded from being obtained.

In the present embodiment, the line width error is acquired using the optical image data with the tone corrected based on the transmissivity distribution for the mask Ma. In other words, the solid optical image data is corrected so as to match the dotted reference image data. This enables the line width of the inspection target pattern to be accurately measured, allowing an accurate line width error to be obtained.

<ΔCD Map Generating Step S8>

The ΔCD map generating step S8 is executed by the map generating unit 123 in FIG. 1. Specifically, the line width error acquisition unit 122 sends the map generating unit 123 the values of line width errors (ΔCD) and the measured values of the position coordinates of the table 101 (sent from the position information unit 104). The map generating unit 123 generates a ΔCD map by plotting the line width errors (ΔCD) in association with the position coordinates on the mask Ma.

For example, the entire measurement pattern is divided into a plurality of unit areas including a predetermined area and a plurality of areas each located near the predetermined area and having the same size as that of the predetermined area. Then, for each unit area, a value is determined which minimizes the absolute value of the difference (ΔCD) between a predetermined area in the optical image of the measurement pattern and a reference image corresponding to the predetermined area or the square sum of differences. Also, for each of the plurality of areas each located near the predetermined area and having the same size as that of the predetermined area, a value is determined which minimizes the absolute value of the difference (ΔCD) between an optical image and a reference image corresponding to the optical image or the square sum of differences. Then, the average value of the resultant values is determined, and the resultant average ΔCD for each unit area is used to generate a map. The unit area may be, for example, a frame.

As described above, in the present embodiment, the line width error in the inspection target pattern is acquired based on the optical image data with the tone corrected based on the transmissivity distribution for the mask Ma. Consequently, an accurate ΔCD map is obtained. Furthermore, in the present embodiment, the line width error is acquired by acquiring and correcting optical image data. This eliminates the need to acquire optical image data for correction before inspection.

The inspection apparatus in the embodiment acquires the transmissivity distribution for transmission of light from the light source through the incident surface of the inspection target, based on the optical image data. The inspection apparatus then corrects the tone of the optical image data so as to eliminate variations in the contrast of the optical image data which correspond to the transmissivity distribution. The inspection apparatus enables defect inspection to be easily and accurately performed and allows an accurate ΔCD map to be acquired.

Embodiment 2

Figure 10:
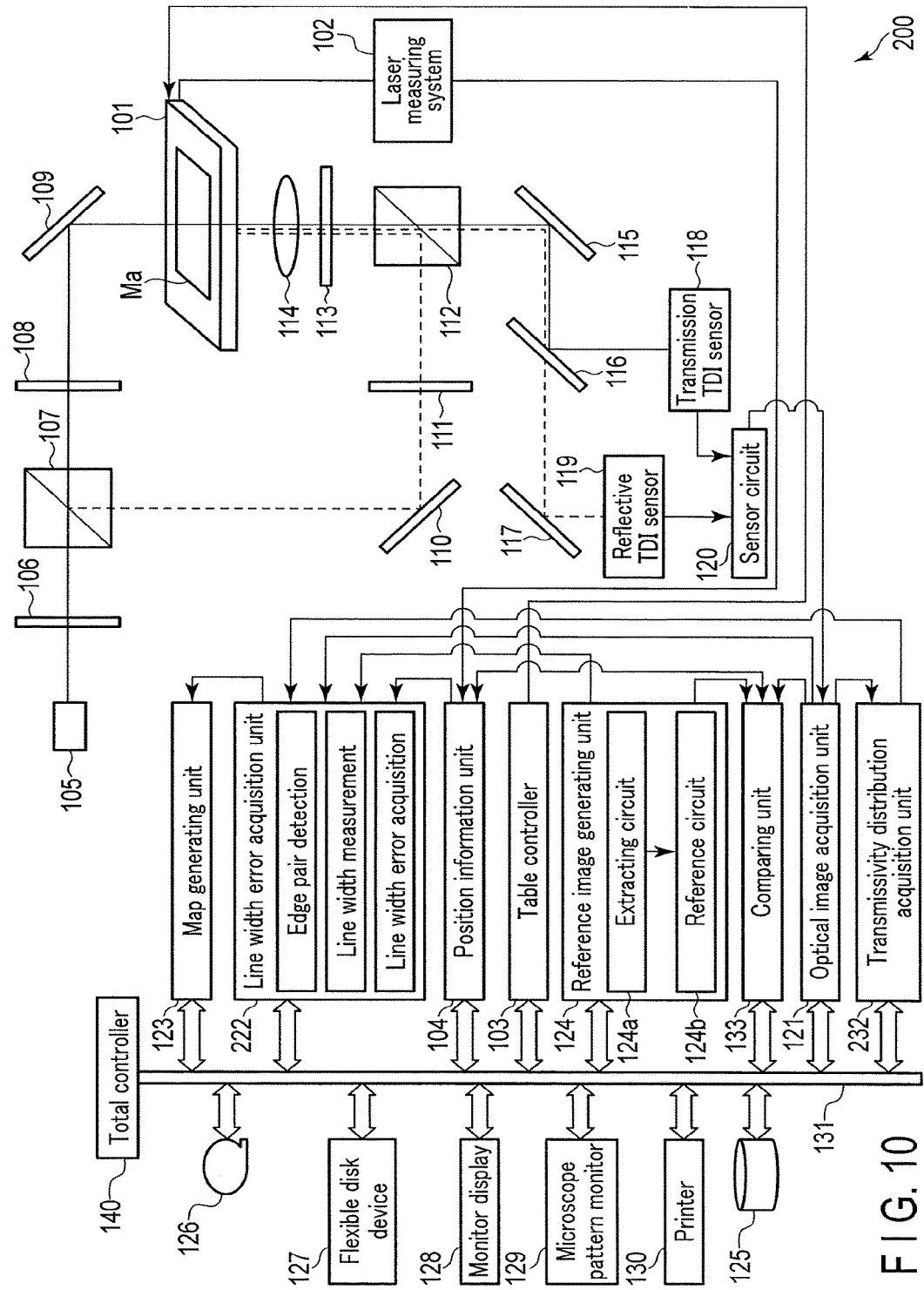
FIG. 10 is a schematic diagram of a configuration of an inspection apparatus in Embodiment 2.
Figure 11:
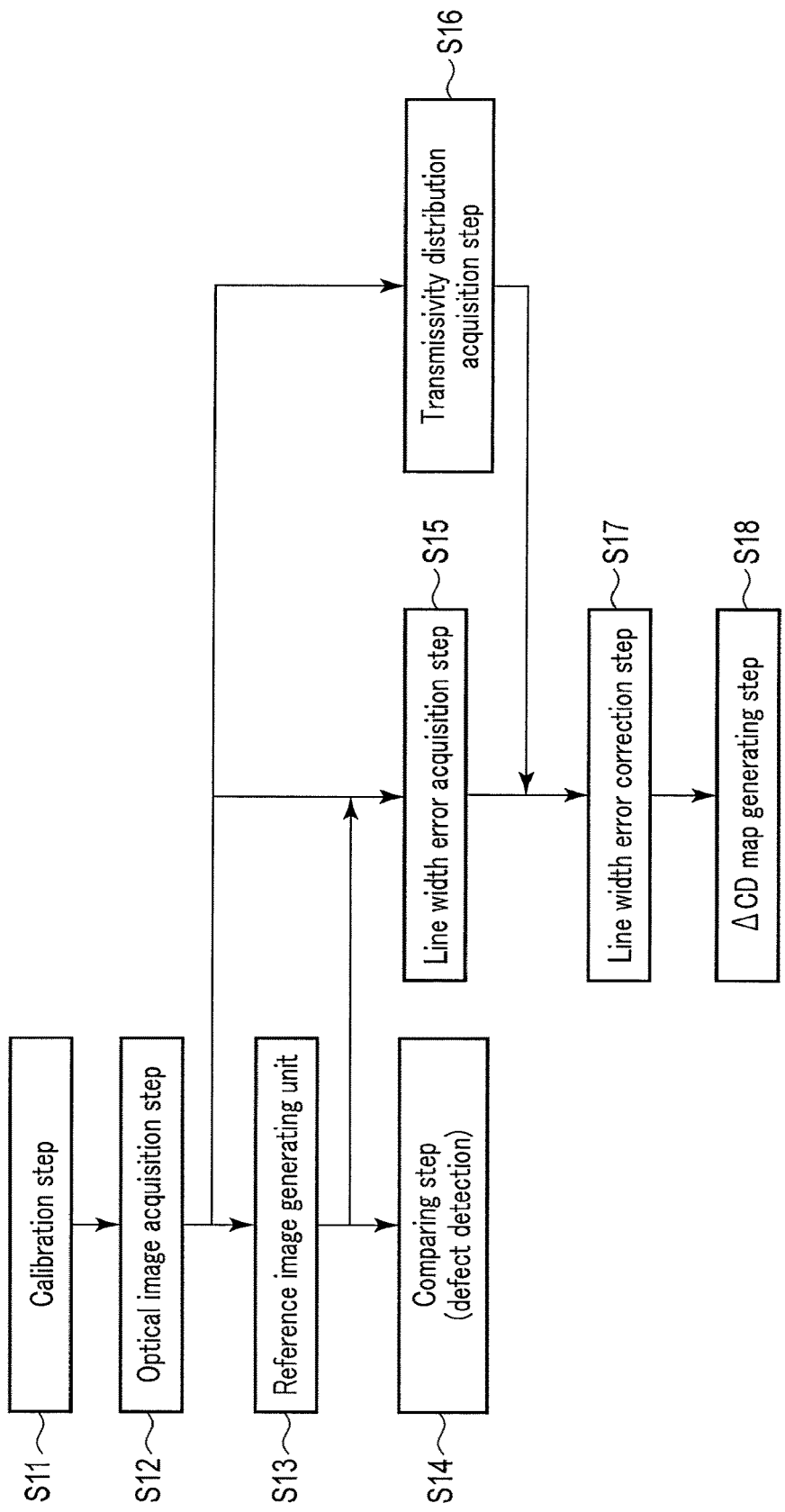
FIG. 11 is a flowchart of an inspection method in Embodiment 2.

FIG. 10 is a schematic diagram of an inspection apparatus 200 in the present embodiment. FIG. 11 illustrates an example of a flow of data in the inspection apparatus 200 in FIG. 10. FIG. 12 is a diagram illustrating an example of a flow of data in the inspection apparatus in FIG. 10. In FIG. 10, FIG. 11 and FIG. 12, components denoted by the same reference numerals are the same and will not be described below.

FIG. 11 is a flowchart of an inspection method according to the present embodiment. As illustrated in FIG. 11, the inspection method according to the present embodiment includes a calibration step S11, an optical image data acquisition step S12, a reference image data generating step S13, a comparing step S14, a line width error acquisition step S15, a transmissivity distribution acquisition step S16, a line width error correction unit S17, and a ΔCD map generating step S18.

The inspection apparatus and the inspection method in the present embodiment will be described below with reference to FIG. 10 and FIG. 11.

In FIG. 11, steps S11 to S14 correspond to steps of detecting possible defects in the inspection target pattern of the mask Ma. The steps are similar to steps S1 to S4 described in Embodiment 1 using FIG. 2.

In FIG. 11, steps S11 to S13 and S15 to S18 correspond to steps of acquiring a line width error in the inspection target pattern of the mask Ma and generating a ΔCD map. Now, steps S15 to S18 will be described.

<Line Width Error Acquisition Step S15>

The line width error (ΔCD) in the inspection target pattern of the mask Ma is acquired using the optical image data acquired in the optical image acquisition step S12. The line width error acquisition step S15 is specifically executed as follows.

First, the optical image acquisition unit 121 sends the optical image data to a line width error acquisition unit 222. The reference image generating unit 124 also sends the reference image data to the line width error acquisition unit 222. The laser measuring system 102 further sends the line width error acquisition unit 222 the measured values of the position coordinates of the table 101 measured by the laser measuring system 102.

The line width error acquisition unit 222 first detects, in the optical image data and the reference image data, an edge pair serving as a reference for measurement of the line width (CD). Subsequently, the line width of each pattern is measured using the detected edge pair. The line width of each pattern is compared with the line width obtained using the corresponding edge pair in the reference image data to determine the difference between the line widths. Thus, the line width error (ΔCD) is acquired. These details are similar to the details described for the line width error acquisition step S7 in Embodiment 1.

Given the line width of each pattern in the optical image data has a value as designed, the difference between the optical image data and the reference image data is zero, in other words, the line width error is zero. However, as described in Embodiment 1, the substrate forming the mask Ma exhibits birefringence, and the directions of the birefringence vary with position. Thus, the transmissivity for light transmitted through the substrate has a distribution in the surface of the substrate. Therefore, the amount of light incident on the sensor is originally to be constant regardless of the position on the mask Ma, but actually varies so as to be large at portions with high transmissivity while being small at portions with low transmissivity. As a result, optical image data acquired by the optical image acquisition unit 121 has contrast corresponding to the transmissivity distribution besides the contrast depending on the presence of a pattern.

When the contrast of the optical image data also varies in accordance with the transmissivity distribution, a reduced amount of light is incident on the sensor at portions with low transmissivity. Consequently, the optical image data forms a solid curve in FIG. 6 described in Embodiment 1. Given the line width of each pattern in the optical image data has a value as designed, the optical image data is to match the reference image data depicted by a dotted line in FIG. 6, and the line width error is to be zero. However, since the optical image data is shaped like a solid curve, the pattern has a line width error (Wopt−Wref). This line width error is not an accurate value. In other words, the line width error acquired in the line width error acquisition step S15 includes an error resulting from the transmissivity distribution. Thus, the line width error acquired in S15 is corrected in the line width error correction step S17 described below.

<Transmissivity Distribution Acquisition Step S16>

In the transmissivity distribution acquisition step S16, the transmissivity distribution for light transmitted through the mask Ma is acquired based on the optical image data acquired in the optical image acquisition step S12.

In FIG. 10, the optical image acquisition unit 121 sends an optical image to the transmissivity distribution acquisition unit 232. The transmissivity distribution acquisition unit 232 acquires the transmissivity of pre-specified portions of the inspection target area on the mask Ma. Specifically, a plurality of portions with no pattern in the inspection target area of the mask Ma, that is, a plurality of portions from which the glass substrate is exposed, are extracted, and the transmissivity is determined for the extracted portions, as is the case with Embodiment 1. Then, based on the acquired transmissivity, the transmissivity distribution for the entire inspection target area on the mask Ma is estimated and acquired.

For example, five portions with no pattern are selected in the inspection target area on the mask Ma along the X direction. For each of the portions, five portions with no pattern are similarly selected along the Y direction. In this manner, a total of 25 portions with no pattern are extracted as measured portions. The size of each of the measured portions is equal to or larger than the diameter (2r) of the airy disc expressed by Equation (3). The wavelength of light is denoted by λ, and the numerical aperture of the image-forming optical system is denoted by NA.

$$2r = 1.22 \times \frac{\lambda}{NA} \qquad (3)$$

In accordance with Equation (3), when the wavelength of light λ=199 nm and the numerical aperture of the image-forming optical system NA=0.80, the diameter (2r) approximately 0.3 μm. Therefore, in this case, for example, 25 areas are extracted each of which has a diameter of 0.3 μm or more and from each of which the glass substrate is exposed. The transmissivity of each area is then acquired. An example of a method for extracting portions the transmissivity of which is to be acquired has been described in Embodiment 1 using FIG. 9.

As described in Embodiment 1, the stress distribution for the mask Ma has a predetermined tendency, and the directions of birefringence also have the corresponding tendency. Thus, when circularly polarized light enters the mask Ma, the circularly polarized light has its polarization characteristics changed according to the directions of birefringence in the surface of the mask Ma (the surface through which light enters the mask M). Specifically, the characteristics of polarization of incident light are maintained near the center of the mask Ma, but a direction in which the transmissivity decreases and a direction in which the transmissivity increases appear symmetrically toward peripheral portions. Determining the polarization characteristics of polarization through the surface of the mask Ma allows the transmissivity distribution in the entire inspection target area to be estimated based on the transmissivity of the predetermined number of portions.

When no portion having no pattern and having an area equal to or larger than the diameter of the airy disc is present in the inspection target area on the mask Ma or the number of such portions is not sufficient to estimate the transmissivity distribution, the transmissivity is acquired for portions outside the inspection target area, for example, four corners of the mask Ma. Then, using the polarization characteristics of polarization through the surface of the mask Ma, the transmissivity distribution for the inspection target area is predicted based on the transmissivity of the four corners.

<Line Width Error Correction Step S17>

The transmissivity distribution acquired by the transmissivity distribution acquisition unit 232 is sent to the line width error acquisition unit 222. Using the transmissivity distribution, the line width error acquisition unit 222 corrects the line width error acquired in the line width error acquisition step S15. This correction is performed, for example, as follows.

First, before inspection of the mask Ma, the relation between the transmissivity and the line width is acquired. Specifically, when an increased transmissivity increases the amount of light incident on the transmission TDI sensor 118 and the reflective TDI sensor 119 in FIG. 10, the measured line width of each pattern is larger than the original line width. Thus, the relation between the degree of change in the amount of light and the resultant increase in line width is experimentally determined. Furthermore, when a reduced transmissivity reduces the amount of light incident on the transmission TDI sensor 118 and the reflective TDI sensor 119 in FIG. 10, the measured line width of each pattern is smaller than the original line width. Thus, the relation between the degree of change in the amount of light and the resultant decrease in line width is experimentally determined. The pattern used in the experiment is not limited to the inspection target pattern on the mask Ma. For example, the following method may be used. A plurality of types of representative patterns are prepared and the line widths of the patterns are measured. Subsequently, the relation between the line width and the transmissivity of a pattern that is the same as or similar to the inspection target pattern is acquired. Then, based on this relation, the relation between the line width and the transmissivity of the inspection target pattern is derived.

Using the above-described relation between the transmissivity and the line width, the line width error determined by the line width error acquisition unit 222 is corrected based on the transmissivity distribution acquired by the transmissivity distribution acquisition unit 232.

The correction as described above allows an accurate line width error to be obtained for the inspection target pattern.

<ΔCD Map Generating Step S18>

The ΔCD map generating step S18 in FIG. 11 is executed by the map generating unit 123 in FIG. 10. Specifically, the line width error acquisition unit 222 sends the map generating unit 123 the values of line width errors (ΔCD) and the measured values of the position coordinates of the table 101 (sent from the position information unit 104). The map generating unit 123 generates a ΔCD map by plotting the line width errors (ΔCD) in association with the position coordinates on the mask Ma.

For example, the entire measurement pattern is divided into a plurality of unit areas including a predetermined area and a plurality of areas each located near the predetermined area and having the same size as that of the predetermined area. Then, for each unit area, a value is determined which minimizes the absolute value of the difference (ΔCD) between a predetermined area in the optical image of the measurement pattern and a reference image corresponding to the predetermined area or the square sum of differences. Also for each of the plurality of areas each located near the predetermined area and having the same size as that of the predetermined area, a value is determined which minimizes the absolute value of the difference (ΔCD) between an optical image and a reference image corresponding to the optical image or the square sum of differences. Then, the average value of the resultant values is determined, and the resultant average ΔCD for each unit area is used to generate a map. The unit area may be, for example, a frame.

As described above, in the present embodiment, the line width error is corrected based on the transmissivity distribution for the mask Ma, providing an accurate ΔCD map. Generation of a ΔCD map may be performed simultaneously with defect detection. Moreover, in the present embodiment, after optical image data is acquired, the line width error is acquired, and then, the line width error is corrected to generate a ΔCD map. This eliminates the need to store all of the optical image data until a ΔCD map is generated.

The embodiments of the inspection apparatus and the inspection method have been described. However, the embodiments are not limited to the inspection apparatus and the inspection method described in the description. Various modifications, improvements, combinations, and the like may be made to the embodiments. The embodiments encompass all inspection apparatuses and inspection methods which comprise elements of the embodiment and which may be designed and modified as needed by those skilled in the art.

For example, in the above-described embodiments, the line width of a line pattern is determined, a line width error between the determined line width and a design value is acquired, and then, a line width error map is acquired. However, the present embodiments are applicable to any pattern dimension other than the line width. For example, for a hole-shaped pattern, the diameter of each hole is determined, a dimensional error between the determined diameter and a design value is acquired, and then, a dimensional error map is acquired.

The inspection apparatus in the embodiments acquires the transmissivity distribution for transmission of light from the light source through the incident surface of the inspection target, determines the dimension of the pattern based on the optical image data, acquires a dimensional error between the dimension of the pattern and the design value for the pattern, and corrects the dimensional error based on the transmissivity distribution and the relation between the transmissivity for light from the light source and the dimension of the pattern. The inspection apparatus enables defect inspection to be easily and accurately performed and allows an accurate ΔCD map to be acquired.

For the inspection apparatus illustrated in the present application, configuration units needed for the embodiments are described. Other well-known configuration units may be included which are needed for the line width error and for inspection. The "XX units" described in the present application may be configured using programs that can operate in a computer. However, the "XX units" may be implemented not only by programs corresponding to software but also by a combination of hardware and software or a combination of hardware and firmware. When the "XX units" are configured using programs, the programs are recorded in a storage device such as a magnetic disk device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inspection apparatus comprising:
   a table on which an inspection target is placed;
   circuitry configured to
      measure position coordinates of the table;
      emit light from a light source that illuminates the inspection target;
      illuminate the inspection target with a first light from the light source such that the first light is transmitted through the inspection target; and
      illuminate the inspection target with a second light from the light source such that the second light is reflected by the inspection target;
   a first sensor entered by the first light to convert an optical image of the inspection target into an electric signal;
   a second sensor entered by the second light to convert an optical image of the inspection target into an electric signal; and
   a polarization beam splitter configured to transmit the first light and the second light,
   wherein the circuitry is further configured to
      detect possible defects in a pattern provided on the inspection target using optical image data output from at least one of the first sensor and the second sensor;
      acquire a transmissivity distribution for a plurality of positions on an incident surface of the inspection target based on the optical image data, the transmissivity distribution being correlated with a light amount transmitted through the inspection target at each respective position;
      correct a tone of the optical image data using the transmissivity distribution;
      determine a line width of the pattern based on the optical image data having the corrected tone;
      acquire a line width error that is a difference between the line width of the pattern and a design value for the pattern; and
      generate a map in which the line width error is associated with the position coordinates of the table on the inspection target based on the position coordinates and the line width error.

2. The apparatus according to claim 1, wherein the circuitry is configured to acquire the transmissivity distribution based on a transmissivity of portions of the inspection target which have a size equal to or larger than a diameter of an airy disc and on which the pattern is not provided and based on polarization characteristics of polarization of the light from the light source through the incident surface of the inspection target.

3. An inspection apparatus comprising:
   a table on which an inspection target is placed;
   circuitry configured to
      measure position coordinates of the table;
      emit light from a light source that illuminates the inspection target;
      transmit a first light from the light source to illuminate the inspection target with the first light; and
      reflect a second light from the light source to illuminate the inspection target with the second light;
   a first sensor entered by the first light to convert an optical image of the inspection target into an electric signal;
   a second sensor entered by the second light to convert an optical image of the inspection target into an electric signal;
   a polarization beam splitter configured to transmit the first light and the second light,
   wherein the circuitry is further configured to
   detect possible defects in a pattern provided on the inspection target using optical image data output from at least one of the first sensor and the second sensor;
   acquire a transmissivity distribution for a plurality of positions on an incident surface of the inspection target based on the optical image data, the transmissivity distribution being correlated with a light amount transmitted through the inspection target at each respective position;
   correct a tone of the optical image data using the transmissivity distribution;
   determine a line width of the pattern based on the optical image data having the corrected tone;
   acquire a line width error that is a difference between the line width of the pattern and a design value for the pattern; and generate a map in which the line width error is associated with the position coordinates of the table on the inspection target based on the position coordinates and the line width error.

4. The apparatus according to claim 3, wherein the circuitry is configured to acquire the transmissivity distribution based on a transmissivity of portions of the inspection target which have a size equal to or larger than a diameter of an airy disc and on which the pattern is not provided and based on polarization characteristics of polarization of the light from the light source through the incident surface of the inspection target.

5. An inspection method comprising:
turning linearly polarized light emitted from a light source into circularly polarized light by a first quarter-wavelength plate and illuminating an inspection target with the circularly polarized light such that the circularly polarized light is transmitted through the inspection target, turning the circularly polarized light transmitted through the inspection target into linearly polarized light by a second quarter-wavelength plate, then allowing light transmitted through a polarization beam splitter to enter a first sensor, and converting an optical image of the inspection target into an electric signal to acquire optical image data;
turning linearly polarized light emitted from the light source into circularly polarized light by the second quarter-wavelength plate and illuminating the inspection target with the circularly polarized light such that the circularly polarized light is reflected by the inspection target, turning the circularly polarized light reflected by the inspection target into linearly polarized light by the second quarter-wavelength plate, then allowing light transmitted through the polarization beam splitter to enter a second sensor, and converting an optical image of the inspection target into an electric signal to acquire optical image data;
generating reference image data from design data on a pattern provided on the inspection target;
detecting possible defects in the pattern by comparing the optical image data acquired in the acquisition of the optical image data through the first sensor with the reference image data;
acquiring a transmissivity distribution for a plurality of positions on an incident surface of the inspection target based on the optical image data, the transmissivity distribution being correlated with a light amount transmitted through the inspection target at each respective position;
correcting a tone of the optical image data using the transmissivity distribution;
determining a line width of the pattern based on the optical image data having the corrected tone;
acquiring a line width error that is a difference between the line width of the pattern and a design value for the pattern; and
generating a map in which the line width error is associated with position coordinates on the inspection target.

6. The method according to claim 5, wherein the acquiring the transmissivity distribution acquires the transmissivity distribution based on a transmissivity of portions of the inspection target which have a size equal to or larger than a diameter of an airy disc and on which the pattern is not provided and based on polarization characteristics of polarization of the light from the light source through the incident surface of the inspection target.

7. The inspection apparatus according to claim 1, wherein the circuitry is configured to correct the line width error by determining a relationship between a change in the light amount transmitted through the inspection target indicating a transmissivity at each respective position and a resultant change in the line width at the respective position.

8. The inspection apparatus according to claim 3, wherein the circuitry is configured to correct the line width error by determining a relationship between a change in the light amount transmitted through the inspection target indicating a transmissivity at each respective position and a resultant change in the line width at the respective position.

9. The inspection method according to claim 5, further comprising correcting the line width error by determining a relationship between a change in the light amount transmitted through the inspection target indicating a transmissivity at each respective position and a resultant change in the line width at the respective position.

* * * * *